US012610869B2

(12) United States Patent
Kang et al.

(10) Patent No.:     US 12,610,869 B2
(45) Date of Patent:        Apr. 21, 2026

(54) INTEGRATED CIRCUIT (IC) PACKAGE EMPLOYING A METAL BLOCK WITH METAL INTERCONNECTS THERMALLY COUPLING A DIE TO AN INTERPOSER SUBSTRATE FOR DISSIPATING THERMAL ENERGY OF THE DIE, AND RELATED FABRICATION METHODS

(71) Applicant: QUALCOMM Incorporated, San Diego, CA (US)

(72) Inventors: Kuiwon Kang, San Diego, CA (US); Joan Rey Villarba Buot, Escondido, CA (US); Bohan Yan, San Diego, CA (US); Manuel Aldrete, Encinitas, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 420 days.

(21) Appl. No.: 18/330,435

(22) Filed: Jun. 7, 2023

(65) Prior Publication Data

US 2024/0413137 A1        Dec. 12, 2024

(51) Int. Cl.
*H10W 90/00* (2026.01)
*H10W 40/22* (2026.01)
(Continued)

(52) U.S. Cl.
CPC ......... *H10W 90/00* (2026.01); *H10W 40/228* (2026.01); *H10W 90/701* (2026.01);
(Continued)

(58) Field of Classification Search
CPC ............... H01L 25/105; H01L 23/3677; H01L 23/49816; H01L 24/16; H01L 24/32;
(Continued)

(56) References Cited

U.S. PATENT DOCUMENTS

2019/0355680 A1    11/2019    Chuang et al.
2021/0035880 A1    2/2021    Goh et al.
(Continued)

OTHER PUBLICATIONS

International Search Report and Written Opinion for International Patent Application No. PCT/US2024/031021, mailed Oct. 7, 2024, 13 pages.

(Continued)

*Primary Examiner* — Fernando L Toledo
*Assistant Examiner* — Shawn Shaw Muslim
(74) *Attorney, Agent, or Firm* — Withrow & Terranova, PLLC

(57)        ABSTRACT

Aspects disclosed in the detailed description include an integrated circuit (IC) package employing a metal block with metal interconnects thermally coupling a semiconductor die ("die") to an interposer substrate for dissipating thermal energy in the die. The die is coupled to a package substrate to provide signal routing paths to the die. To facilitate additional dies being stacked in the IC package as a three-dimensional (3D) IC (3DIC) package, the IC package also includes an interposer substrate adjacent to the die. The interposer substrate supports providing additional signal routing paths to the package substrate. The interposer substrate also includes a metal block which comprises a plurality of metal layers and is thermally coupled to the die and a metal interconnect(s) in the interposer substrate to dissipate thermal energy from the die through the metal block and through the coupled metal interconnect(s).

18 Claims, 18 Drawing Sheets

(51) Int. Cl.

| | |
|---|---|
| *H10W 72/00* | (2026.01) |
| *H10W 72/20* | (2026.01) |
| *H10W 72/30* | (2026.01) |
| *H10W 74/15* | (2026.01) |

(52) U.S. Cl.
CPC ................ *H10W 72/07253* (2026.01); *H10W 72/07254* (2026.01); *H10W 72/07354* (2026.01); *H10W 72/07554* (2026.01); *H10W 72/234* (2026.01); *H10W 72/242* (2026.01); *H10W 72/342* (2026.01); *H10W 74/15* (2026.01); *H10W 90/722* (2026.01); *H10W 90/723* (2026.01); *H10W 90/752* (2026.01)

(58) Field of Classification Search
CPC ..................... H01L 24/48; H01L 24/73; H01L 2224/16057; H01L 2224/16113; H01L 2224/16137; H01L 2224/16146; H01L 2224/32112; H01L 2224/48101; H01L 2224/48145; H01L 2224/73104; H01L 2224/73204; H01L 2924/15321; H01L 2924/15331; H01L 2924/19103; H01L 2924/19105; H01L 2225/1023; H01L 2225/1058; H01L 23/3735; H01L 23/5385; H05K 1/185; H05K 2201/10734; H05K 1/0206; H05K 2201/10416
See application file for complete search history.

(56) References Cited

U.S. PATENT DOCUMENTS

| | | | |
|---|---|---|---|
| 2021/0125961 A1 | 4/2021 | Tsai et al. | |
| 2022/0157757 A1 | 5/2022 | Seok et al. | |
| 2023/0037331 A1* | 2/2023 | Chen ................... | H01L 23/3735 |
| 2023/0082412 A1 | 3/2023 | Lee et al. | |
| 2024/0332146 A1 | 10/2024 | Buot et al. | |

OTHER PUBLICATIONS

U.S. Appl. No. 18/193,295, filed Mar. 30, 2023.

* cited by examiner

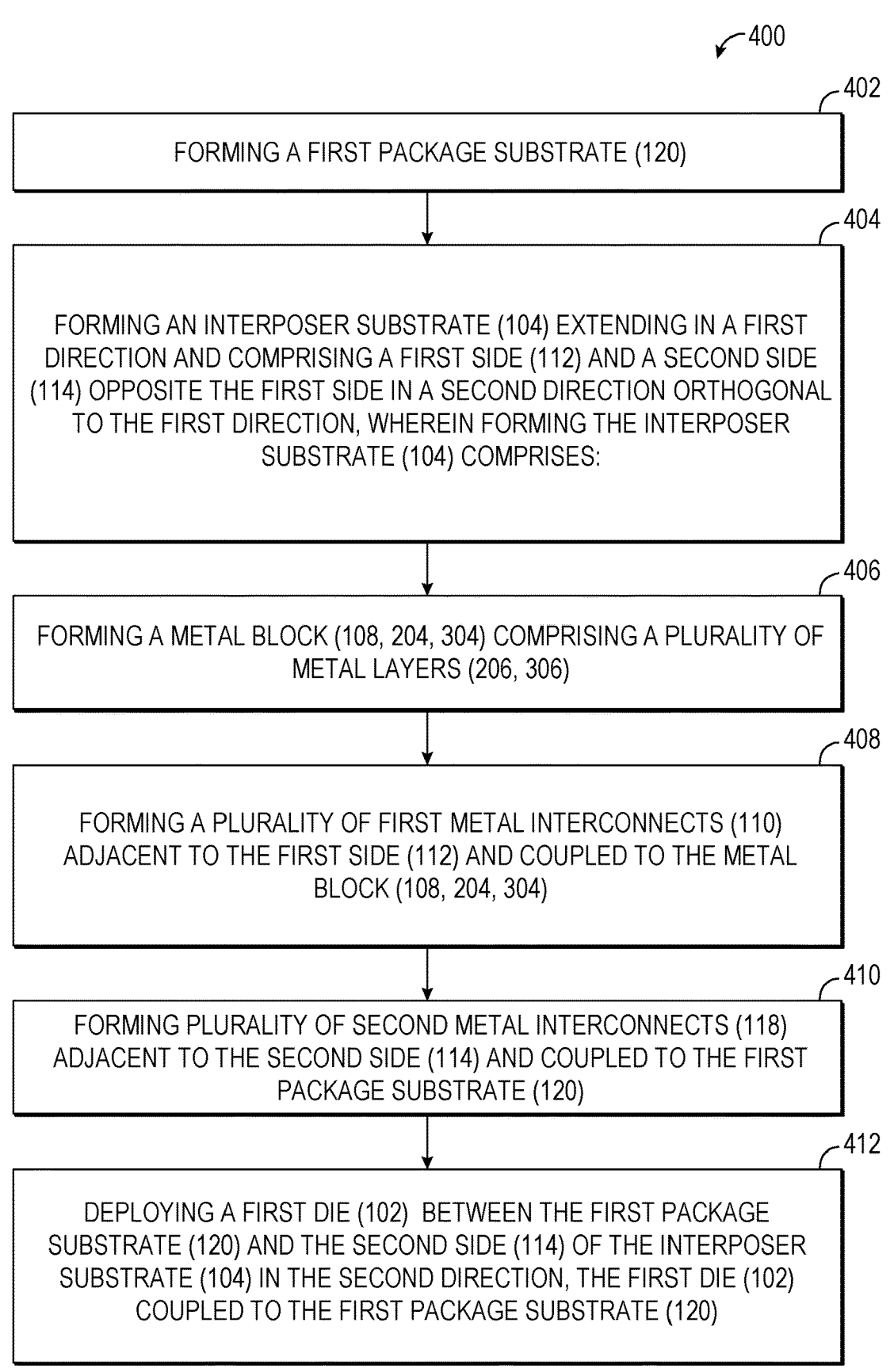

400

402

FORMING A FIRST PACKAGE SUBSTRATE (120)

404

FORMING AN INTERPOSER SUBSTRATE (104) EXTENDING IN A FIRST DIRECTION AND COMPRISING A FIRST SIDE (112) AND A SECOND SIDE (114) OPPOSITE THE FIRST SIDE IN A SECOND DIRECTION ORTHOGONAL TO THE FIRST DIRECTION, WHEREIN FORMING THE INTERPOSER SUBSTRATE (104) COMPRISES:

406

FORMING A METAL BLOCK (108, 204, 304) COMPRISING A PLURALITY OF METAL LAYERS (206, 306)

408

FORMING A PLURALITY OF FIRST METAL INTERCONNECTS (110) ADJACENT TO THE FIRST SIDE (112) AND COUPLED TO THE METAL BLOCK (108, 204, 304)

410

FORMING PLURALITY OF SECOND METAL INTERCONNECTS (118) ADJACENT TO THE SECOND SIDE (114) AND COUPLED TO THE FIRST PACKAGE SUBSTRATE (120)

412

DEPLOYING A FIRST DIE (102) BETWEEN THE FIRST PACKAGE SUBSTRATE (120) AND THE SECOND SIDE (114) OF THE INTERPOSER SUBSTRATE (104) IN THE SECOND DIRECTION, THE FIRST DIE (102) COUPLED TO THE FIRST PACKAGE SUBSTRATE (120)

Figures 5A, 6A, 6B, 6C:
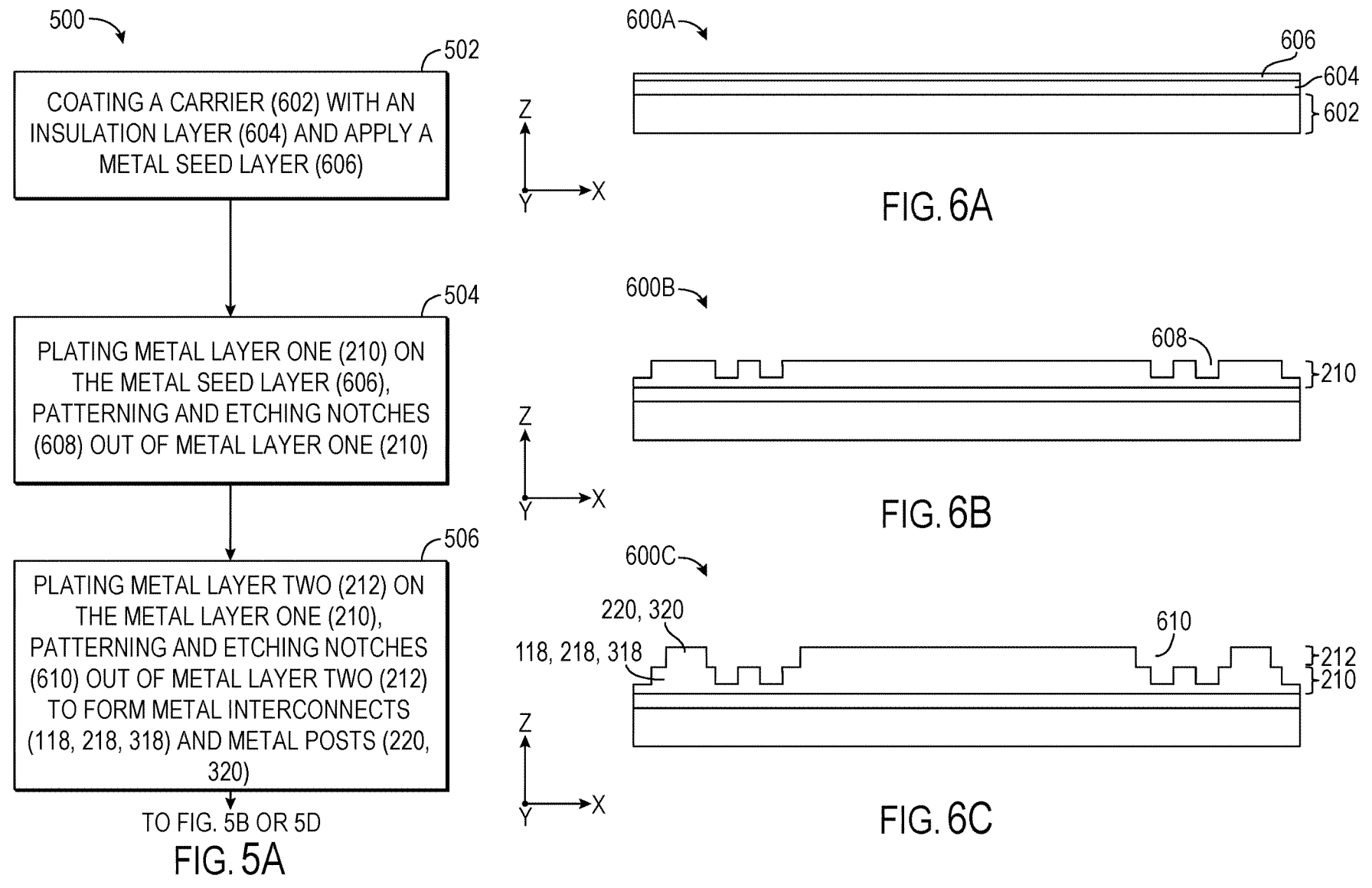

COATING A CARRIER (602) WITH AN INSULATION LAYER (604) AND APPLY A METAL SEED LAYER (606)

504

PLATING METAL LAYER ONE (210) ON THE METAL SEED LAYER (606), PATTERNING AND ETCHING NOTCHES (608) OUT OF METAL LAYER ONE (210)

506

PLATING METAL LAYER TWO (212) ON THE METAL LAYER ONE (210), PATTERNING AND ETCHING NOTCHES (610) OUT OF METAL LAYER TWO (212) TO FORM METAL INTERCONNECTS (118, 218, 318) AND METAL POSTS (220, 320)

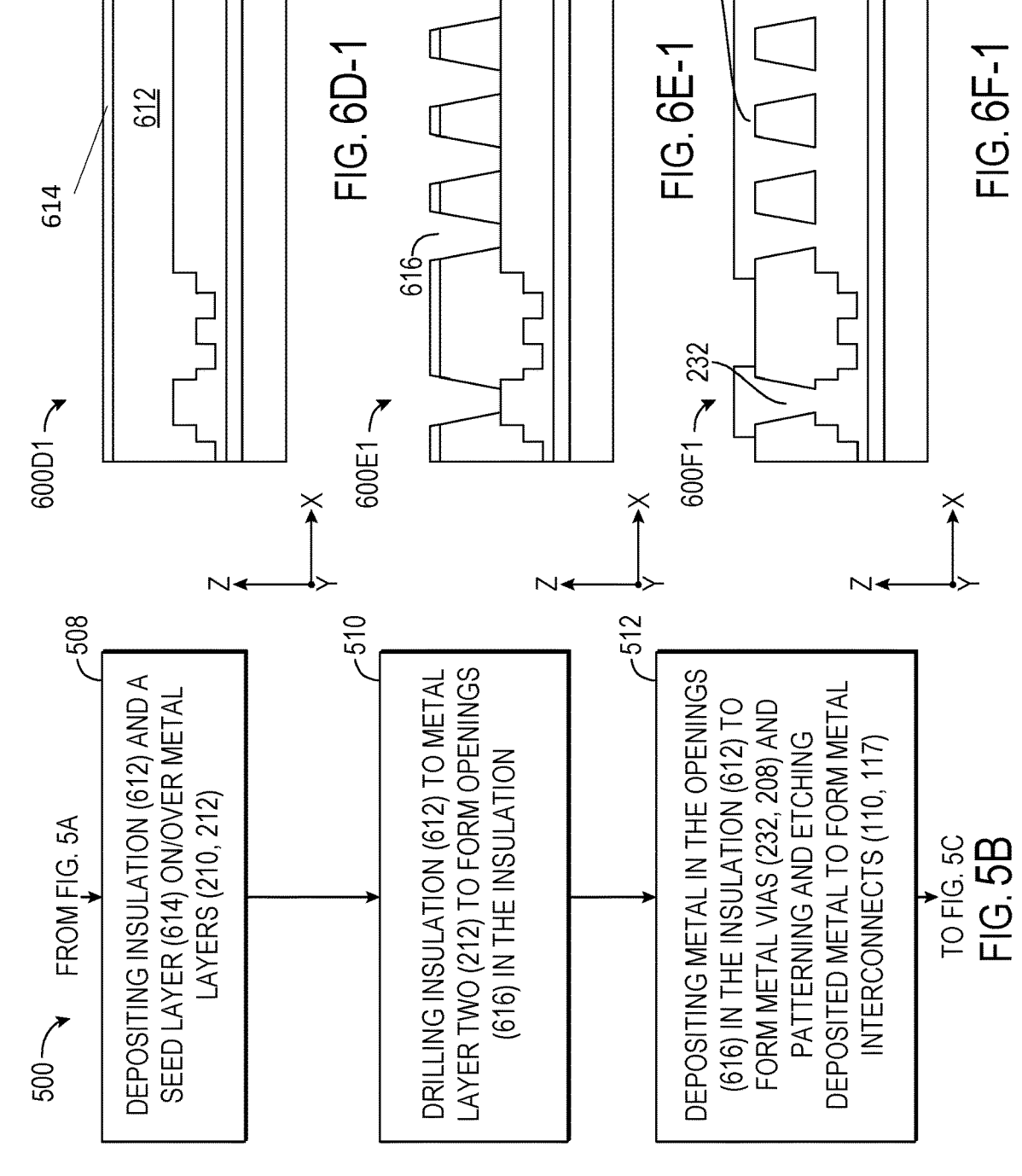

600G1

600H1    112

600I1    136

618

620

202

114

X

Y    Z

X

Y    Z

X

Y    Z

500

514    FROM FIG. 5B    REMOVING CARRIER (602) AND, AS A RESULT, REMOVING INSULATION LAYER (604)

516    DEPOSITING INSULATION LAYERS (618, 620) ON TOP AND BOTTOM OF INTERPOSER SUBSTRATE (104) TO FORM FIRST AND SECOND SIDES (112, 114) TO COMPLETE CORE LAYER (202)

518    DEPOSITING SOLDER BALLS (136) ON FIRST SIDE (112) OF INTERPOSER SUBSTRATE (104)

Figures 5D, 6D-2, 6E-2, 6F-2:
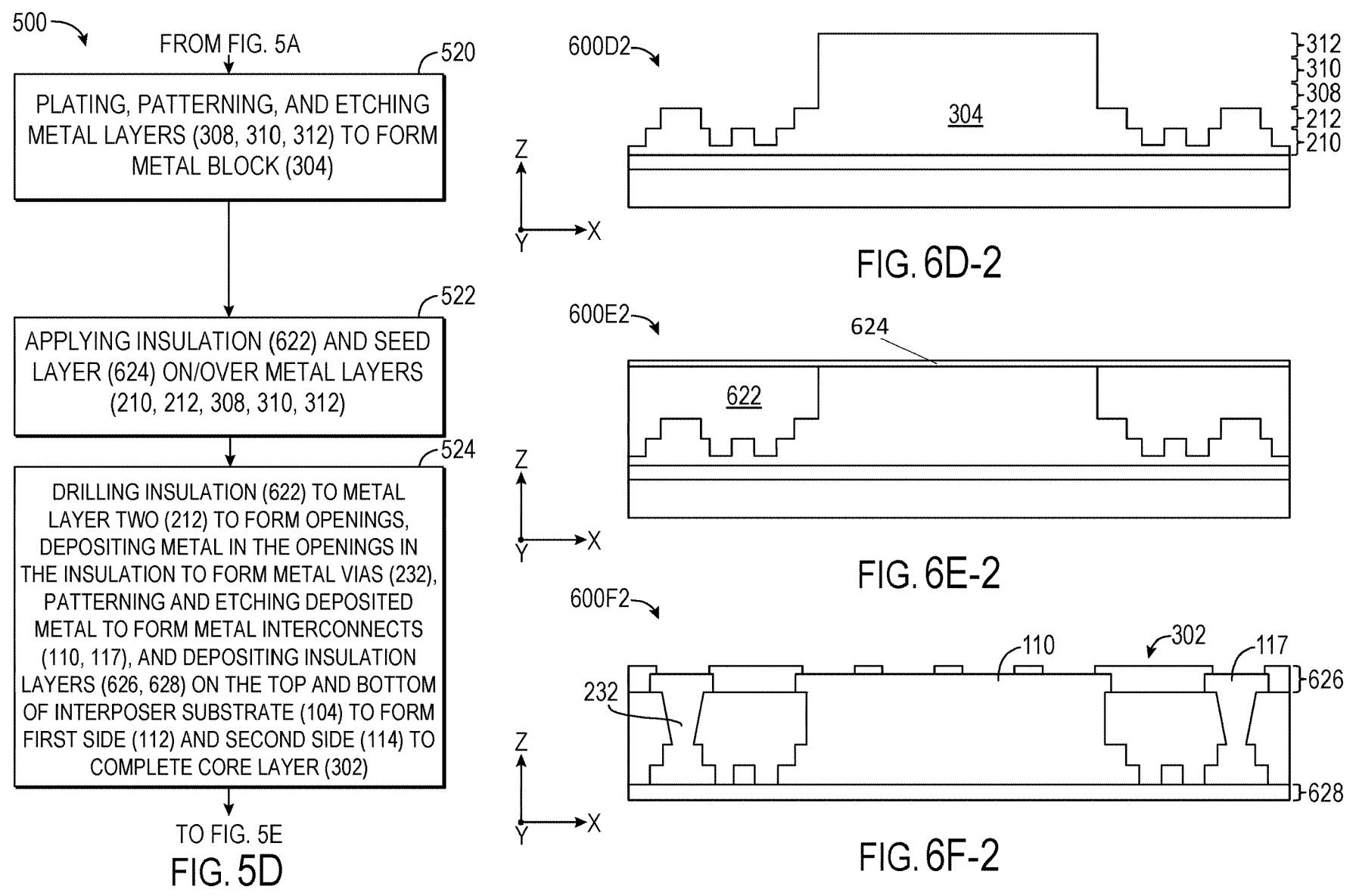

FROM FIG. 5A

PLATING, PATTERNING, AND ETCHING METAL LAYERS (308, 310, 312) TO FORM METAL BLOCK (304)

522

APPLYING INSULATION (622) AND SEED LAYER (624) ON/OVER METAL LAYERS (210, 212, 308, 310, 312)

524

DRILLING INSULATION (622) TO METAL LAYER TWO (212) TO FORM OPENINGS, DEPOSITING METAL IN THE OPENINGS IN THE INSULATION TO FORM METAL VIAS (232), PATTERNING AND ETCHING DEPOSITED METAL TO FORM METAL INTERCONNECTS (110, 117), AND DEPOSITING INSULATION LAYERS (626, 628) ON THE TOP AND BOTTOM OF INTERPOSER SUBSTRATE (104) TO FORM FIRST SIDE (112) AND SECOND SIDE (114) TO COMPLETE CORE LAYER (302)

702
PROVIDING A FIRST DIE (102) COUPLED TO A PACKAGE SUBSTRATE (120)

704
APPLYING A THERMAL INTERFACE MATERIAL (802) TO A BACK SIDE (804) OF THE FIRST DIE (102)

TO FIG. 7B

FROM FIG. 7A

706

BONDING, THROUGH THERMAL COMPRESSION, THE INTERPOSER SUBSTRATE (104) TO THE PACKAGE SUBSTRATE (120)

708

INSERTING MOLDING COMPOUND (803) TO FILL SPACE BETWEEN THE INTERPOSER SUBSTRATE (104), THE FIRST DIE (102), AND THE PACKAGE SUBSTRATE (120)

FROM FIG. 7B

MOUNTING SOLDER BALLS (806), AND MOUNTING EXTERNAL CAPACITORS (808) TO THE LAND SIDE OF THE PACKAGE SUBSTRATE (120)

ATTACHING A SECOND PACKAGE (138) TO INTERPOSER SUBSTRATE (104) WITH SOLDER BALLS (136)

INTEGRATED CIRCUIT (IC) PACKAGE EMPLOYING A METAL BLOCK WITH METAL INTERCONNECTS THERMALLY COUPLING A DIE TO AN INTERPOSER SUBSTRATE FOR DISSIPATING THERMAL ENERGY OF THE DIE, AND RELATED FABRICATION METHODS

BACKGROUND

I. Field of the Disclosure

The field of the disclosure relates to integrated circuit (IC) packages, and more particularly to design and manufacture of an IC package to dissipate thermal energy away from a semiconductor die(s) in the IC package.

II. Background

Integrated circuits (ICs) are the cornerstone of electronic devices. ICs are packaged in an IC package, also called a "semiconductor package" or "chip package." The IC package includes one or more semiconductor dice ("dies" or "dice") as an IC(s) that are mounted on and electrically coupled to a package substrate to provide physical support and an electrical interface to the die(s). The package substrate includes one or more metallization layers that include metal interconnects (e.g., metal traces, metal lines) with vias coupling the metal interconnects together between adjacent metallization layers to provide electrical interfaces between the die(s). The die(s) is electrically interfaced to metal interconnects exposed in a top or outer metallization layer of the package substrate to electrically couple the die(s) to the metal interconnects of the package substrate. For example, the package substrate may include a laminate substrate or an embedded trace substrate (ETS) layer adjacent to and electrically coupled to a die to provide signal routing paths to the die. Metal interconnects in the outer metallization layer of the package substrate are coupled to other metal interconnects in other, lower metallization layers in the package substrate to provide signal routing paths to a coupled die.

Some IC packages are known as "hybrid" IC packages, which include multiple die packages with respective dies for different purposes or applications. For example, a hybrid IC package may be an application die, such as a communications modem or processor (including a system). The hybrid IC package could also include, for example, one or more memory dies to provide memory to support data storage and access by the application die. Multiple dies could be disposed in a single die layer and disposed adjacent to each other in a horizontal direction on a package substrate in the IC package. The multiple dies could also be provided in their own respective die packages that are stacked on top of each other in a three-dimensional (3D) arrangement as an overall 3DIC package. A die in a die layer is typically encased in an epoxy molding compound (EMC) to protect the die. 3DIC packages may be desired to reduce the cross-sectional area of the package. In a 3DIC package, a first, bottom die directly supported on a package substrate is electrically coupled through die interconnects to metallization layers of the package substrate to provide signal routing paths for the die in the package substrate. Other stacked dies that are not directly adjacent to the package substrate in the 3DIC package can be electrically coupled to the package substrate by wire bonds and/or intermediate interposers to provide die-to-die (D2D) connections between the multiple stacked dies. In addition to protecting the die, the EMC provides some thermal dissipation of thermal energy generated by the first bottom die.

Today's dies in an IC package are increasing in functionality and in operational speeds. As the functionality/speed of a die increases, thermal energy generated within the die typically increases and can exceed the thermal dissipation capacity of the IC package. An increase in the functionality or speed of a die leads to the need to dissipate the thermal energy generated within the die. Efficient dissipation of thermal energy can be particularly important in 3DIC packages that include multiple stacked dies that each generate heat.

SUMMARY

Aspects disclosed in the detailed description include an integrated circuit (IC) package employing a metal block with metal interconnects thermally coupling a semiconductor die ("die") to an interposer substrate for dissipating thermal energy in the die. Related fabrication methods are also disclosed. The IC package includes a die layer that includes a die coupled to a package substrate to provide signal routing paths to the die. As an example, to facilitate additional dies being stacked in the IC package as a three-dimensional (3D) IC (3DIC) package, the IC package also includes an interposer substrate adjacent to the die. The interposer substrate supports providing additional signal routing paths to the package substrate for external connections and/or die-to-die (D2D) connections. In an exemplary aspect, the interposer substrate also includes a metal block which comprises a plurality of metal layers and is thermally coupled to the die and a metal interconnect(s) (e.g., metal trace, metal pad, metal line, metal plate) in the interposer substrate. In this manner, as thermal energy is generated in the die, this thermal energy dissipates from the die through the metal block, through the coupled metal interconnect(s), and out of the interposer substrate. Thus, metal interconnects and metal layers, which are an available feature in an interposer substrate fabrication process, are deployed to provide heat dissipation for the die in the IC package.

In this regard, in one exemplary aspect, an IC package is provided. The IC package comprises a first package substrate and an interposer substrate extending in a first direction. The interposer substrate comprises a first side and a second side opposite the first side in a second direction orthogonal to the first direction. The interposer substrate also comprises a metal block comprising a plurality of metal layers, a plurality of first metal interconnects adjacent to the first side and coupled to the metal block, and a plurality of second metal interconnects adjacent to the second side and coupled to the first package substrate. The IC package also comprises a first die between the first package substrate and the second side of the interposer substrate in the second direction, the first die coupled to the first package substrate. The metal block, in one aspect, may couple to the metal interconnects through metal vias. In another aspect, the plurality of metal layers will be enough for the metal block to directly couple to the metal interconnects.

In another aspect, a method of fabricating an IC package is provided. The method of fabricating an integrated circuit (IC) package, comprises forming a first package substrate and forming an interposer substrate extending in a first direction and comprising a first side and a second side opposite the first side in a second direction orthogonal to the first direction. Forming the interposer substrate comprises forming a metal block comprising a plurality of metal layers, forming a plurality of first metal interconnects adjacent to the first side and coupled to the metal block, and forming plurality of second metal interconnects adjacent to the second side and coupled to the first package substrate. The method of fabricating the IC package further comprises deploying a first die between the first package substrate and the second side of the interposer substrate in the second direction, the first die coupled to the first package substrate.

BRIEF DESCRIPTION OF THE DRAWINGS

FIG. 4 is a flowchart illustrating an exemplary fabrication process of fabricating an IC package that includes an interposer substrate thermally coupled to a first die through a metal block for dissipating thermal energy in the first die, including the interposer substrate in FIGS. 1, 2A-2C, and 3A-3C;

FIGS. 5A-5C is a flowchart illustrating another exemplary fabrication process of fabricating the interposer substrate that includes a metal block having a plurality of metal layers and directly coupled to first metal interconnects for dissipating thermal energy of the die;

FIGS. 5D-5E is a flowchart illustrating another exemplary fabrication process of fabricating an interposer substrate that includes a metal block having a plurality of metal layers and thermally coupled to first metal interconnects for dissipating thermal energy of a die;

FIGS. 6A-6I-1 are exemplary fabrication stages during fabrication of the interposer substrate according to the fabrication process in FIGS. 5A-5C;

FIGS. 6D-2-6G-2 are exemplary fabrication stages during fabrication of the interposer substrate according to the fabrication process in FIGS. 5D-5E;

DETAILED DESCRIPTION

Figure 1:
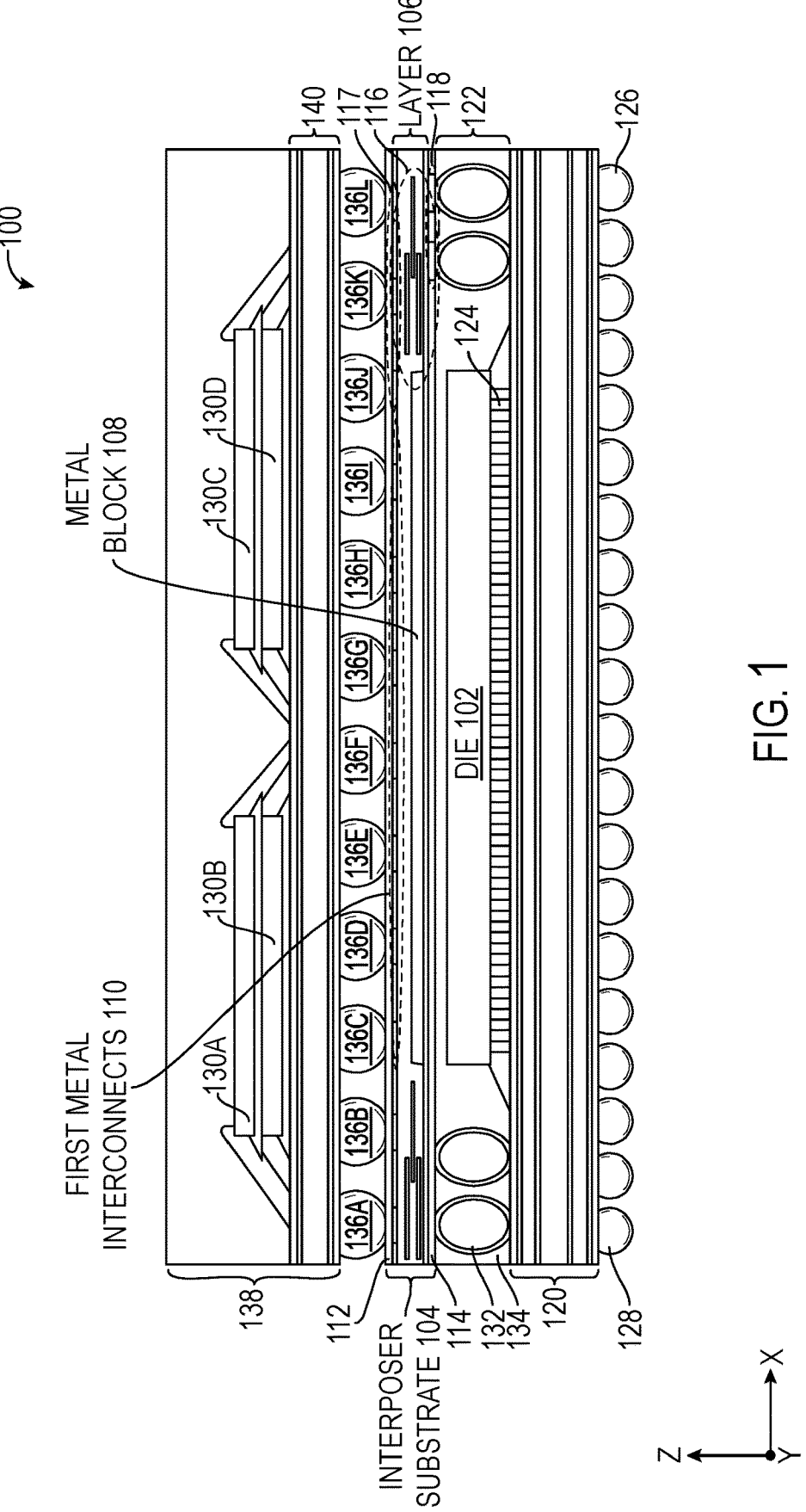
FIG. 1 is a side view of an integrated circuit (IC) package that includes a die and an interposer substrate having a core layer adjacent to the die, the core layer including a metal block with first metal interconnects thermally coupling the die to the interposer substrate for dissipating thermal energy of the die.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include an integrated circuit (IC) package employing a metal block with metal interconnects thermally coupling a semiconductor die ("die") to an interposer substrate for dissipating thermal energy in the die. Related fabrication methods are also disclosed. The IC package includes a die layer that includes a die coupled to a package substrate to provide signal routing paths to the die. As an example, to facilitate additional dies being stacked in the IC package as a three-dimensional (3D) IC (3DIC) package, the IC package also includes an interposer substrate adjacent to the die. The interposer substrate supports providing additional signal routing paths to the package substrate for external connections and/or die-to-die (D2D) connections. In an exemplary aspect, the interposer substrate also includes a metal block which comprises a plurality of metal layers and is thermally coupled to the die and a metal interconnect(s) (e.g., metal trace, metal pad, metal line, metal plate) in the interposer substrate. In this manner, as thermal energy is generated in the die, this thermal energy dissipates from the die through the metal block, through the coupled metal interconnect(s), and out of the interposer substrate. Thus, metal interconnects and metal layers, which are an available feature in an interposer substrate fabrication process, are deployed to provide heat dissipation for the die in the IC package.

In this regard, FIG. 1 is a side view of an integrated circuit (IC) package 100 that includes a die 102 and an interposer substrate 104 having a core layer 106 and is adjacent to the die 102. The core layer 106 includes a metal block 108 with first metal interconnects 110 thermally coupling the die 102 to the interposer substrate 104 for dissipating thermal energy of the die 102. The metal block 108 and the first metal interconnects 110 and the manner in which the metal block 108 couples to the first metal interconnects 110 will be described in more detail in connection with the description of FIGS. 2 and 3.

An object being "adjacent" as discussed in this application relates to an object being beside, on, or next to another object with intervening space between them. Adjacent objects may not be physically coupled to each other. Directly adjacent objects means that such objects are directly beside or next to each other without another of the objects being intervening or disposed between the directly adjacent objects. Non-directly adjacent objects means that such objects are not directly beside or next to each other without another of the objects being intervening or disposed between the non-directly adjacent objects.

The interposer substrate 104 extends in a first, horizontal direction(s) (X- and/or Y-axis direction(s)) and includes a first side 112 and a second side 114 opposite the first side 112 in a second direction (Z-axis direction) orthogonal to the first direction. The first metal interconnects 110 are adjacent to the first side 112 of the interposer substrate 104. As thermal energy is generated in the die 102, this thermal energy dissipates through the metal block 108 and the first metal interconnects 110.

Outside the periphery of the metal block 108 (shown to the left and right of the metal block 108 within the core layer 106 in FIG. 1), the interposer substrate 104 includes metal layers 116 each with routing metal interconnects (e.g., metal traces, metal lines, metal pads) for providing signal and/or power routing through the interposer substrate 104. The metal layers 116 include metal interconnects 117 on the first side 112 of the interposer substrate 104 and metal interconnects 118 on the second side 114 of the interposer substrate 104. Signal and/or power routing between non-directly adjacent metallization layers in the interposer substrate 104 are provided by metal vias (not shown), which are vertical metal interconnects extending in the second, vertical direction (Z-axis direction). The interposer substrate 104 is electrically coupled to a first die layer 122 that includes the die 102 coupled to a package substrate 120 through the metal interconnects 117 and metal interconnects 118.

For example, the package substrate 120 could be a laminate substrate or an embedded trace substrate (ETS). The package substrate 120 includes a plurality of metallization layers (not shown) that each include respective metal interconnects (not shown) (e.g., metal traces, metal lines, metal pads) for providing signal routing to the die 102 in the first die layer 122 coupled to the package substrate 120. The metallization layers are parallel to each other and directly adjacent to each other, and extend in a first, horizontal direction(s) (X- and/or Y-axis direction(s)). The die 102 is disposed between the package substrate 120 and the interposer substrate 104, extends in the first, horizontal direction(s) (X- and/or Y-axis direction(s)), and is electrically coupled to the package substrate 120 by die interconnects 124. The package substrate 120 is configured to provide signal and/or power routing paths through the coupling of its metal interconnects in its respective metallization layers between the die 102 and external interconnects 126 (e.g., solder balls, ball grid array (BGA) interconnects, etc.) for the IC package 100.

As shown in FIG. 1, the external interconnects 126 are on a land side 128 of the package substrate 120. The IC package 100 is arranged such that there is also electrical coupling provided between the interposer substrate 104 and the package substrate 120. This is so that, for example, signal routing can be provided between one or more second die(s) 130A-130D coupled to the interposer substrate 104 and the package substrate 120 and/or the external interconnects 126 within the IC package 100. In this regard, vertical interconnects 132 (e.g., metal posts, metal pillars, metal balls) are disposed in the lower, first die layer 122 and surrounded by a molding compound 134 and coupled to the metal vias (not shown) in the interposer substrate 104 and the package substrate 120 to provide an electrical connection between the interposer substrate 104 and the package substrate 120.

With continuing reference to FIG. 1, external interconnects 136A-136L (e.g., metal posts, metal pillars, metal balls) couple a package 138 to the interposer substrate 104. The package 138 includes a package substrate 140. In this example, external interconnects 136A-136C and external interconnects 136J-136L electrically routes signals and/or power lines from the second die(s) 130A-130D to the package substrate 120 through the interposer substrate 104 including the metal layers 116 and vertical interconnects 132. External interconnects 136A-136C and external interconnects 136J-136L are also referred to herein as routing balls. On the other hand, external interconnects 136D-136I directly connect with the first metal interconnects 110 and thermally couple to the metal block 108 without carrying a signal or a power line and are referred to herein as dummy balls. Additionally, the dummy balls 136D-136I connect to the package 138. The term "thermally coupled" as used herein means that thermal energy is drawn from a heat source to a heat sink or an intermediate conduit of thermal energy to a heat sink.

Figure 2A:
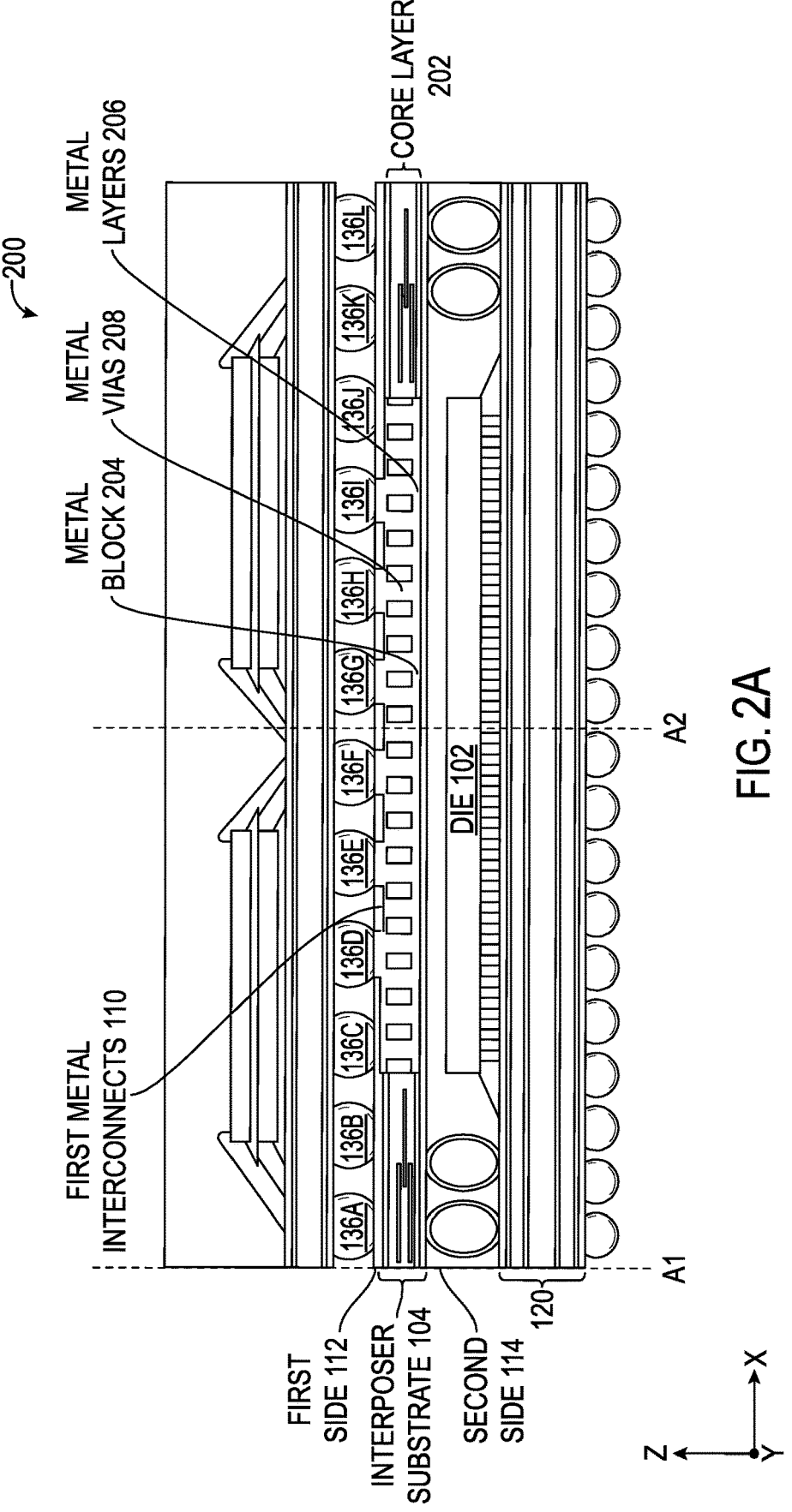
FIG. 2A is a side view of an IC package wherein the interposer substrate includes a core layer that includes a metal block having metal layers coupled to first metal interconnects through metal vias for dissipating thermal energy of the die.

FIG. 2A is a side view of an IC package 200 wherein the interposer substrate 104 includes a core layer 202. The core layer 202 includes a metal block 204 having metal layers 206 coupled to the first metal interconnects 110 through metal vias 208 for dissipating thermal energy of the die 102. Common elements between the IC package 200 in FIGS. 2A-2C and elements of the IC package 100 in FIG. 1 are shown with common element numbers.

Figure 2B:
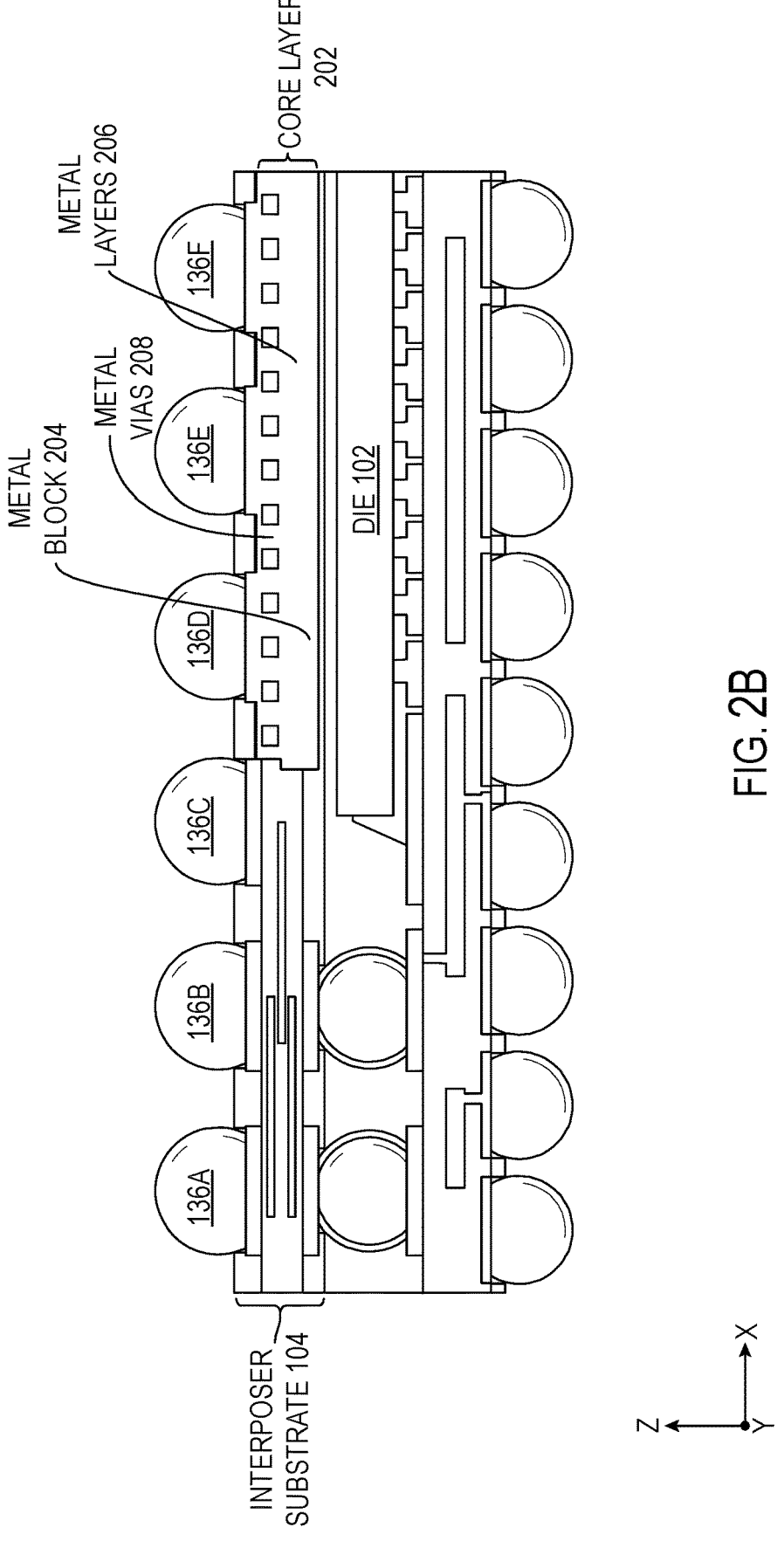
FIG. 2B is a close-up side view of the IC package in FIG. 2A along cut lines A1-A2 in FIG. 2A.

FIG. 2B is a close-up side view of the IC package 200 in FIG. 2A along cut lines A1-A2 in FIG. 2A.

Figure 2C:
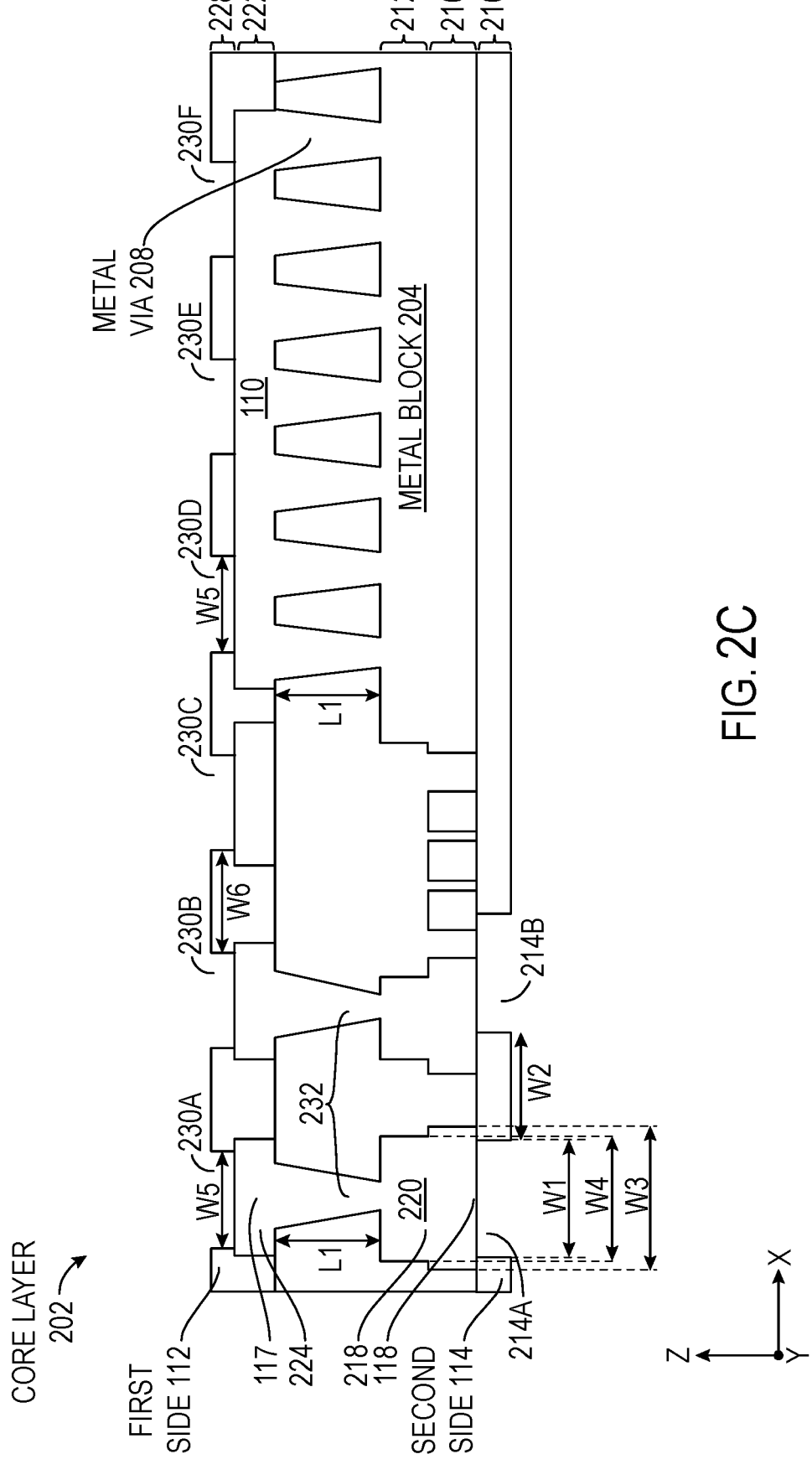
FIG. 2C is a closer-up side view of FIG. 2B showing the measurements of features within the core layer.

FIG. 2C is a closer-up side view of FIG. 2B showing the measurements of features of the core layer 202. The core layer 202 includes metal layer one 210 and metal layer two 212. Metal layer one 210 includes metal pads, metal traces, and metal lines. The metal block 204 includes a portion of metal layer two 212 directly adjacent to a portion of metal layer one 210 in the second, vertical direction (Z-axis direction). The core layer 202 also includes insulator openings 214A, 214B in an insulation layer 216 and is directly adjacent to a metal interconnect 218 (e.g., a metal pad) in metal layer one 210. Insulator opening 214A has a width W1 and is 0.21 millimeters (mm). A width W2 between insulator opening 214A and insulator opening 214B, also known as the pitch, is 0.35 mm. The metal interconnect 218 has a width W3 and is between 0.15-0.25 mm. A metal post 220 is directly adjacent to the metal interconnect 218 in the second, vertical direction (Z-axis direction) and has a width W4. The width W4 is generally 0.02 mm smaller than W3. Metal layer six 222 includes metal pads such as a metal pad 224 and the first metal interconnects 110, metal traces, and metal lines. An insulation layer 228 is directly adjacent to metal layer six 222 in the second, vertical direction (Z-axis direction) and includes openings 230A-230F having a width W5. Insulator openings 230D-230F, which are directly adjacent in the second, vertical direction (Z-axis direction) to the first metal interconnects 110, have the same width W5 as insulator openings 230A-230C, which are directly adjacent in the second, vertical direction (Z-axis direction) to the metal pad 224, in order to deploy dummy balls during an assembly process as will be described in connection with FIG. 6. The width W5 is 0.23 mm. A width W6 between consecutive insulator openings 230A-230F, such as between insulator opening 230B and insulator opening 230C, also known as the pitch, is 0.40 mm. Metal vias 232 and the metal vias 208 connect features in metal layer six 222 with features in metal layer two 212. The metal vias 232 connect the metal interconnects 117 such as the metal pad 224 with the metal interconnects 118 through the metal post 220. When the core layer 202 is deployed in the IC package 200, the metal vias 232 electrically couple a second die 130 to the first package substrate 120 through the vertical interconnects 132 and the metal interconnects 118 such as the metal interconnect 218. The metal vias 208 couple the first metal interconnects 110 to the metal block 204. The metal vias 232 and 208 have a length L1. The length L1 is between 0.015 and 0.03 mm.

Figure 3A:
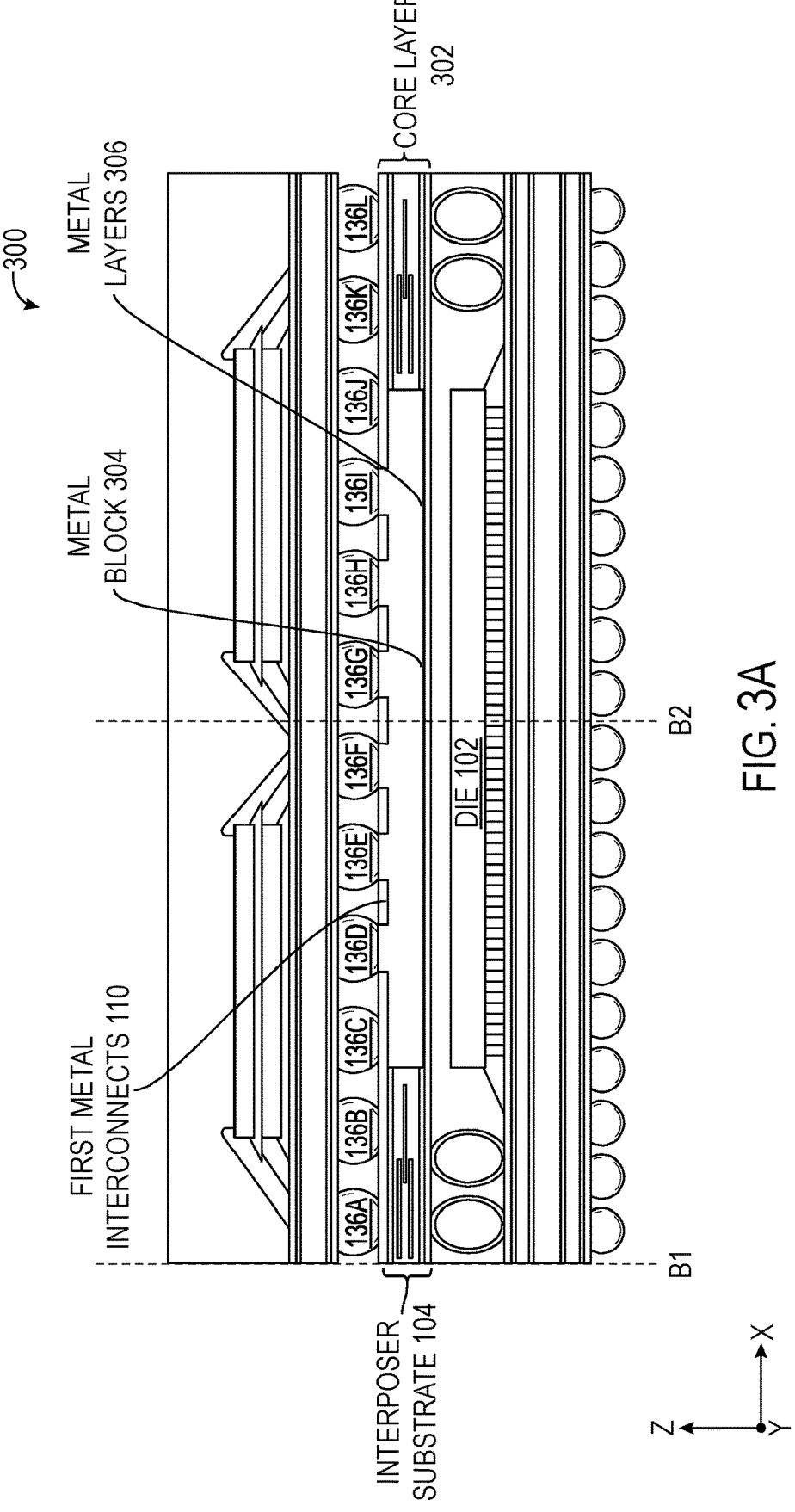
FIG. 3A is a side view of an IC package wherein the core layer includes a metal block having a plurality of metal layers which directly couples to first metal interconnects for dissipating thermal energy of the die.

FIG. 3A is a side view of an IC package 300 wherein a core layer 302 includes a metal block 304 having a plurality of metal layers 306 which directly couples to the first metal interconnects 110 for dissipating thermal energy of the die 102. Common elements between the IC package 300 in FIGS. 3A-3C and elements of the IC package 100 in FIG. 1 and the IC package 200 in FIGS. 2A-2C are shown with common element numbers.

Figure 3B:
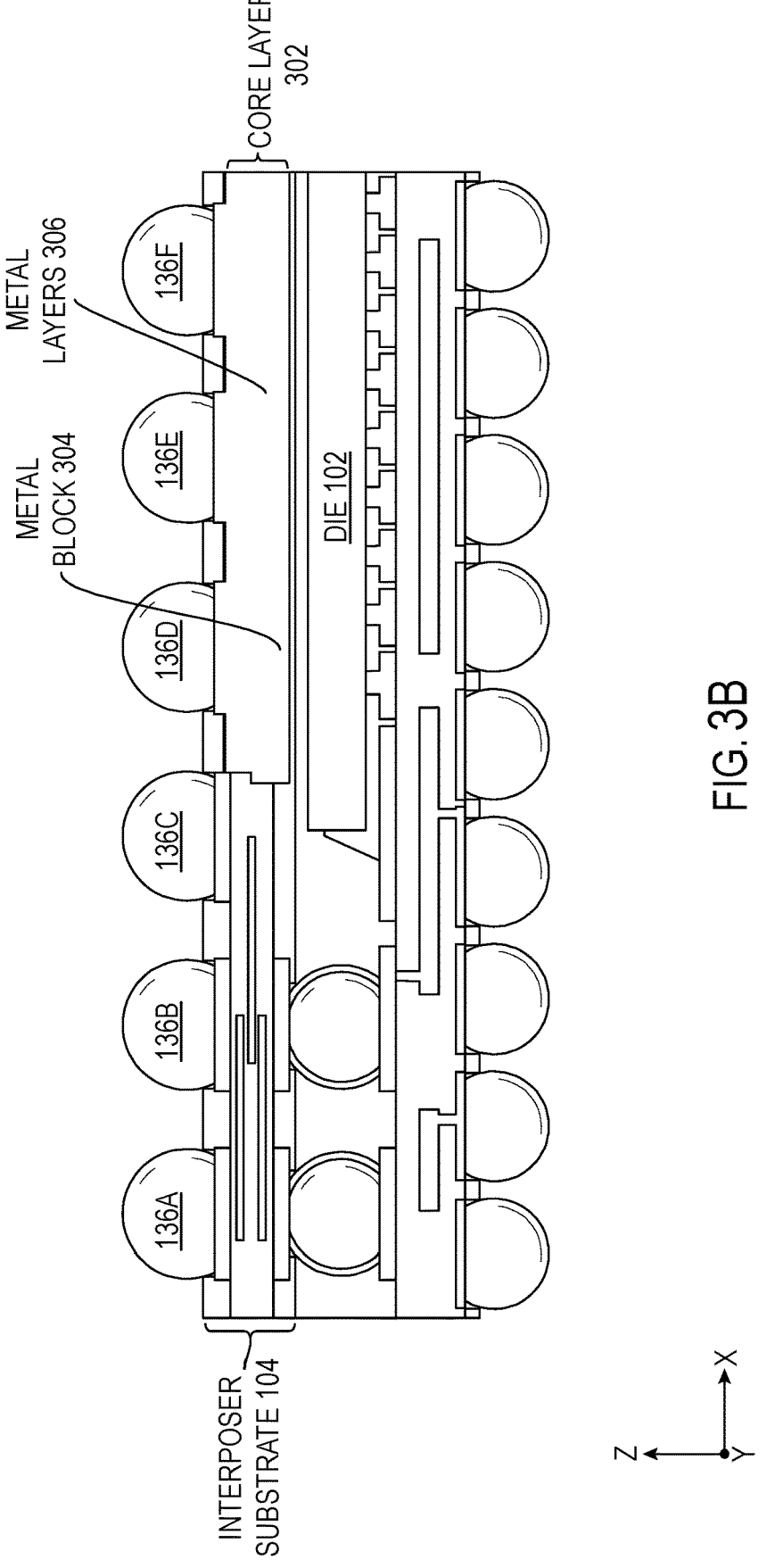
FIG. 3B is a close-up side view of the IC package in FIG. 3A along cut lines B1-B2.
Figure 3C:
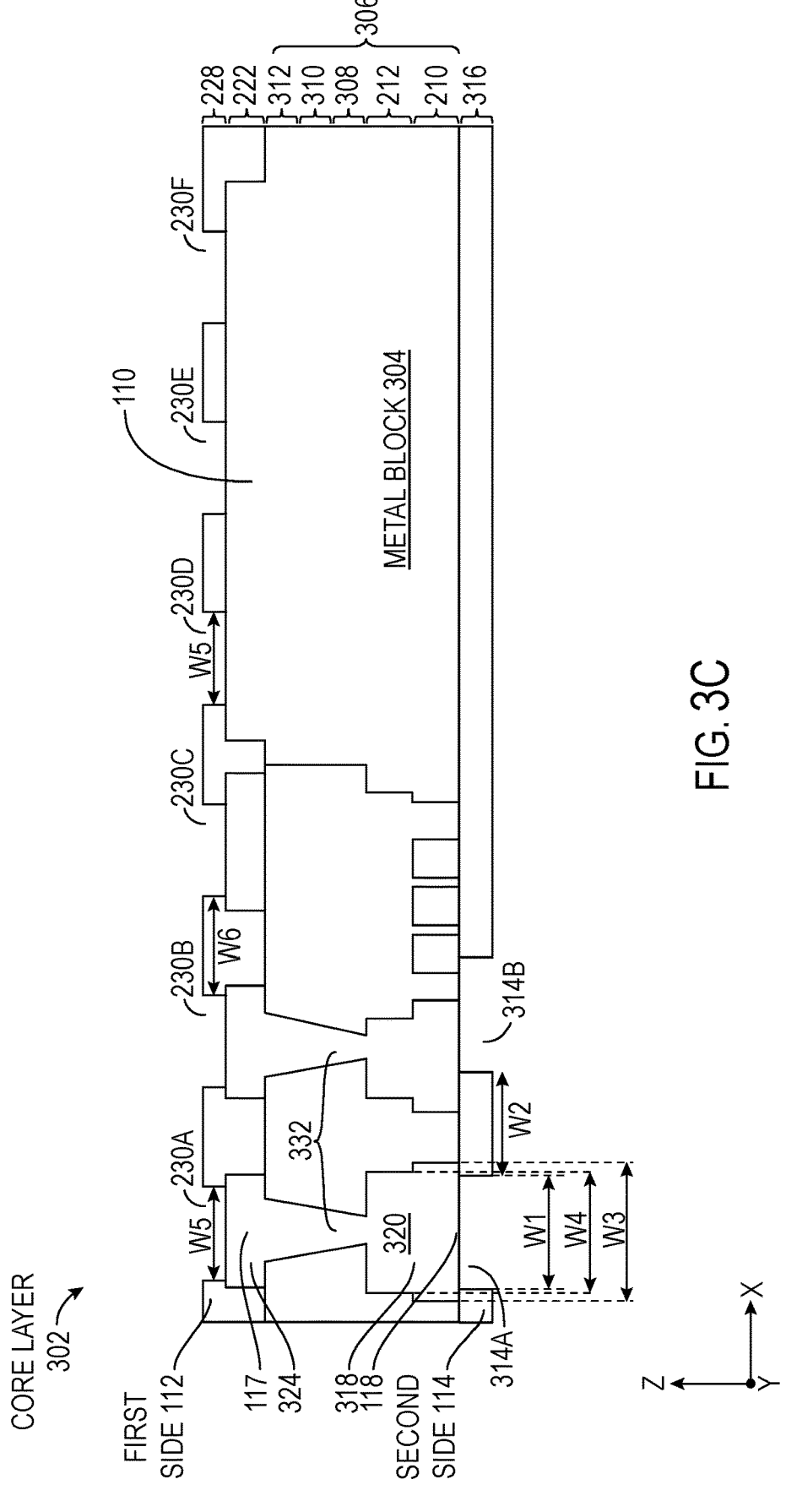
FIG. 3C is a closer up side view of FIG. 2B showing the multiple metal layers of the metal block.

FIG. 3B is a close-up side view of the IC package in FIG. 3A along cut lines B1-B2;

FIG. 3C is a closer up side view of the core layer 302 of FIG. 3B showing the multiple metal layers 306 of the metal block 304. In addition to metal layer one 210 and metal layer two 210, the metal layers 306 of the metal block 304 include metal layer three 308, metal layer four 310, and metal layer five 312. The core layer 302 also includes insulator openings 314A, 314B in an insulation layer 316 and is directly adjacent to a metal interconnect 318 (e.g., metal pad) in metal layer one 210. A metal post 320 is directly adjacent to the metal interconnect 318 (e.g., metal pad) in the second, vertical direction (Z-axis direction). Metal vias 332 connect the metal interconnects 117 such as a metal pad 324 with the metal interconnects 118 such as the metal interconnect 318 through the metal post 320. When the core layer 302 is deployed in the IC package 300, the metal vias 332 electrically couple a second die 130 to the first package substrate 120 through the vertical interconnects 132 and the metal interconnects 118 such as the metal interconnect 318.

An interposer substrate that includes a core layer employing a metal block thermally coupled to a first die for dissipating thermal energy of the first die, including, but not limited to, the core layers 106, 202, and 302 in the related IC packages 100, 200, and 300, respectively, in FIGS. 1, 2A-2C, and 3A-3C, can be fabricated in different fabrication processes. In this regard, FIG. 4 is a flowchart illustrating an exemplary fabrication process 400 of fabricating an IC package that includes an interposer substrate 104 thermally coupled to a first die 102 through a metal block 108 for dissipating thermal energy in the first die 102, including the interposer substrate 104 in FIGS. 1, 2A-2C, and 3A-3C, as an example.

The fabrication process 400 in FIG. 4 will be discussed in conjunction with the interposer substrate 104 in FIGS. 1, 2A-2C, and 3A-3C, but note that such is not limiting. In this regard, a first exemplary step in the fabrication process 400 of FIG. 4 can include forming a first package substrate 120 (block 402). A next step in the fabrication process 400 can include forming an interposer substrate 104 extending in a first direction and comprising a first side 112 and a second side 114 opposite the first side 112 in a second direction orthogonal to the first direction (block 404). Forming the interposer substrate comprises forming a metal block 108, 204, 304 comprising a plurality of metal layers 206, 306 (block 406), forming a plurality of first metal interconnects 110 adjacent to the first side 112 of the interposer substrate 104 and coupled to the metal block 108, 204, 304 (block 408), and forming a plurality of second metal interconnects 118 adjacent to the second side 114 of the interposer substrate 104 and coupled to the first package substrate 120 (block 410). A next step in the fabrication process 400 can include deploying a first die 102 between the first package substrate 120 and the second side 114 of the interposer substrate 104 in the second direction, the first die 102 coupled to the first package substrate 120 (block 412).

Other fabrication processes can also be employed to fabricate an interposer substrate having a core layer that includes employing a metal block thermally coupled to a first die for dissipating thermal energy of the first die, including, but not limited to, the core layers 106, 202, and 302 and related IC packages 100, 200, and 300 in FIGS. 1, 2A-2C, and 3A-3C, respectively. In this regard, FIGS. 5A-5E is a flowchart illustrating another exemplary fabrication process 500 of fabricating an interposer substrate 104 having a core layer that includes a metal block thermally coupled to a first die for dissipating thermal energy of the first die, including, but not limited to, the core layers 106, 202, and 302 and related IC packages 100, 200, and 300 in FIGS. 1, 2A-2C, and 3A-3C, respectively. FIGS. 6A-6I-1 are exemplary fabrication stages 600A-600I1 during fabrication of the core layer 202 according to the fabrication process 500 in FIGS. 5A-5C. FIGS. 6A-6C and 6D-2-6G-2 are exemplary fabrication stages 600A-600C. 600D2-600G2 during fabrication of the core layer 302 according to the fabrication process 500 in FIGS. 5A, 5D, and 5E. The fabrication process 500 in FIGS. 5A-5C as shown in fabrication stages 600A-600I1 in FIGS. 6A-6I-1 are in reference to the core layer 202 and related IC package 200 in FIGS. 2A-2C, and thus will be discussed with reference to the core layer 202 and IC package 200 in FIG. 2A. The fabrication process 500 in FIGS. 5A. 5D, and 5E as shown in fabrication stages 600A-600C and 600D-2-600G-2 in FIGS. 6A-6C and 6D-2-6G-2 are in reference to the core layer 302 and related IC package 300 in FIGS. 3A-3C, and thus will be discussed with reference to the core layer 302 and IC package 300 in FIG. 3A.

Figures 1, 5C, 6G, 6H, 6I:
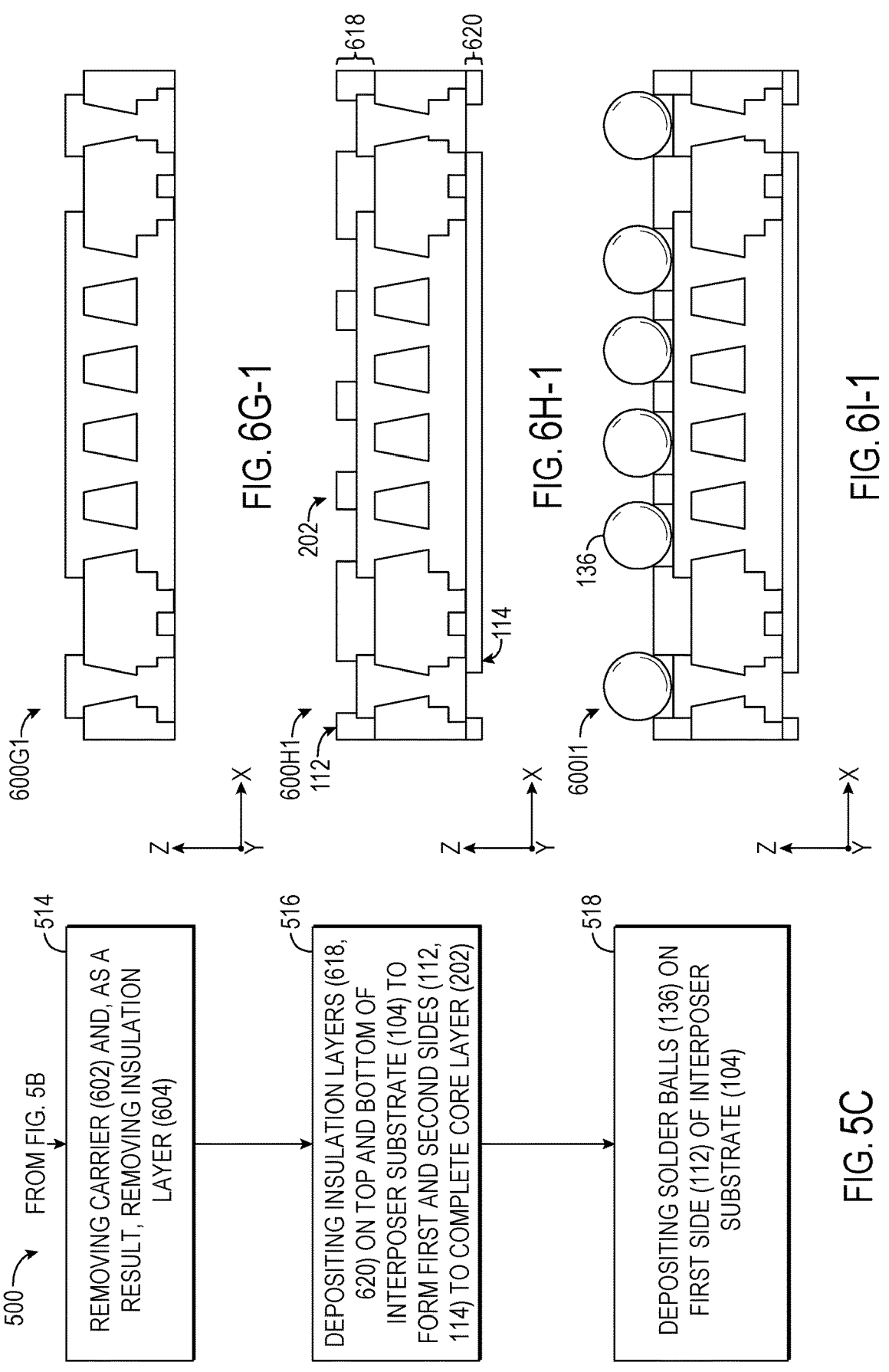
Figures 2, 5E, 6G:
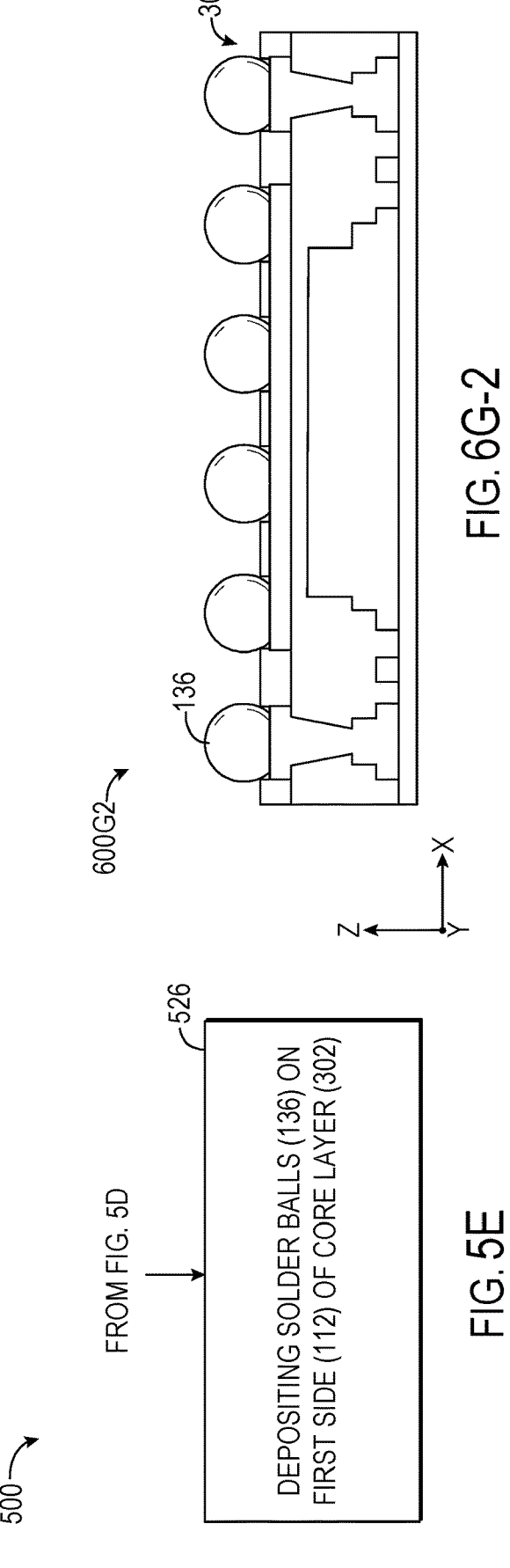

In this regard, as shown at fabrication stage 600A in FIG. 6A, an exemplary step in the fabrication process 500 is to coat a carrier 602 with an insulation layer 604 and a very thin metal seed layer 606 to form the beginnings of an interposer substrate 104 (block 502 in FIG. 5A). As shown in fabrication stage 600B in FIG. 6B, a next step in the fabrication process 500 can include plating metal layer one 210 on the metal seed layer 606, and patterning and etching notches 608 out of metal layer one 210 (block 504 in FIG. 5A). As shown in fabrication stage 600C in FIG. 6C, a next step in the fabrication process 500 can include plating metal layer two 212 on metal layer one 210, and patterning and etching notches 610 out of metal layer two 212 to form metal interconnects 118, 218, 318 and metal posts 220, 320 (block 506 in FIG. 5A). Metal layer two 212 is wider in the second, Z-axis direction than metal layer one 210. As shown in fabrication stage 600D1 in FIG. 6D-1, a next step in the fabrication process 500 can include depositing insulation 612 and seed layer 614 on/over metal layer one 210 and metal layer two 212 (block 508 in FIG. 5B). As shown in fabrication stage 600E1 in FIG. 6E-1, a next step in the fabrication process 500 can include drilling the insulation 612 up to metal layer two 212 to form openings 616 in the insulation 612 (block 510 in FIG. 5B). As shown in fabrication stage 600F1 in FIG. 6F-1, a next step in the fabrication process 500 can include depositing metal in the openings 616 in the insulation 612 to form metal vias 232, 208. Additionally, the next step includes patterning and etching the deposited metal to form metal interconnects 110 and metal interconnects 117 (block 512 in FIG. 5B). As shown in fabrication stage 600G1 in FIG. 6G-1, a next step in the fabrication process 500 can include removing the carrier 602 (block 514 in FIG. 5C). As shown in fabrication stage 600H1 in FIG. 6H-1, a next step in the fabrication process 500 can include depositing insulation layers 618, 620 on the top and bottom of the interposer substrate 104 to form the first side 112 and the second side 114 to complete the core layer 202 (block 516 in FIG. 5C). As shown in fabrication stage 60011 in FIG. 6I-1, a next step in the fabrication process 500 can include depositing solder balls 136 on the first side 112 of the interposer substrate 104 for preparation of assembling the interposer substrate 104 to the package 138 (block 518 in FIG. 5C).

Branching from block 506 in FIG. 5A to block 520 in FIG. 5D, the fabrication process 500 begins the distinctive process for forming the core layer 302. At block 520, as shown in fabrication stage 600D2 in FIG. 6D-2, a next step in the fabrication process 500 includes plating, patterning, and etching metal layers including metal layer three 308, metal layer four 310, and metal layer five 312 to form metal block 304 (block 520 in FIG. 5D). As shown in fabrication stage 600E2 in FIG. 6E-2, a next step in the fabrication process 500 can include applying insulation 622 and seed layer 624 on/over the metal layers 210, 212, 308, 310, and 312 (block 522 in FIG. 5D). As shown in fabrication stage 600F2 in FIG. 6F-2, a next step in the fabrication process 500 can include drilling the insulation 622 to metal layer two 212 to form openings, depositing metal in the openings in the insulation 622 to form metal vias 232, patterning and etching the deposited metal to form metal interconnects 110, 117 to form the core layer 302, and depositing insulation layers 626 and 628 on the top and bottom of the interposer substrate 104 to form the first side 112 and second side 114 and to complete the core layer 302 (block 524 in FIG. 5D). As shown in fabrication stage 600G2 in FIG. 6G-2, a next step in the fabrication process 500 can include depositing solder balls 136 on the first side 112 of the core layer 302 in preparation of assembling the interposer substrate 104 to the package 138 (block 526 in FIG. 5E).

An IC package that includes an interposer substrate 104 having a core layer 106 which employs a metal block 108 thermally coupled to a first die for dissipating thermal energy of the first die, including, but not limited to, the IC packages 100, 200, and 300 in FIGS. 1, 2A-2C, and 3A-3C, respectively, can be assembled utilizing different assembly processes.

Figures 7A, 8A, 8B:
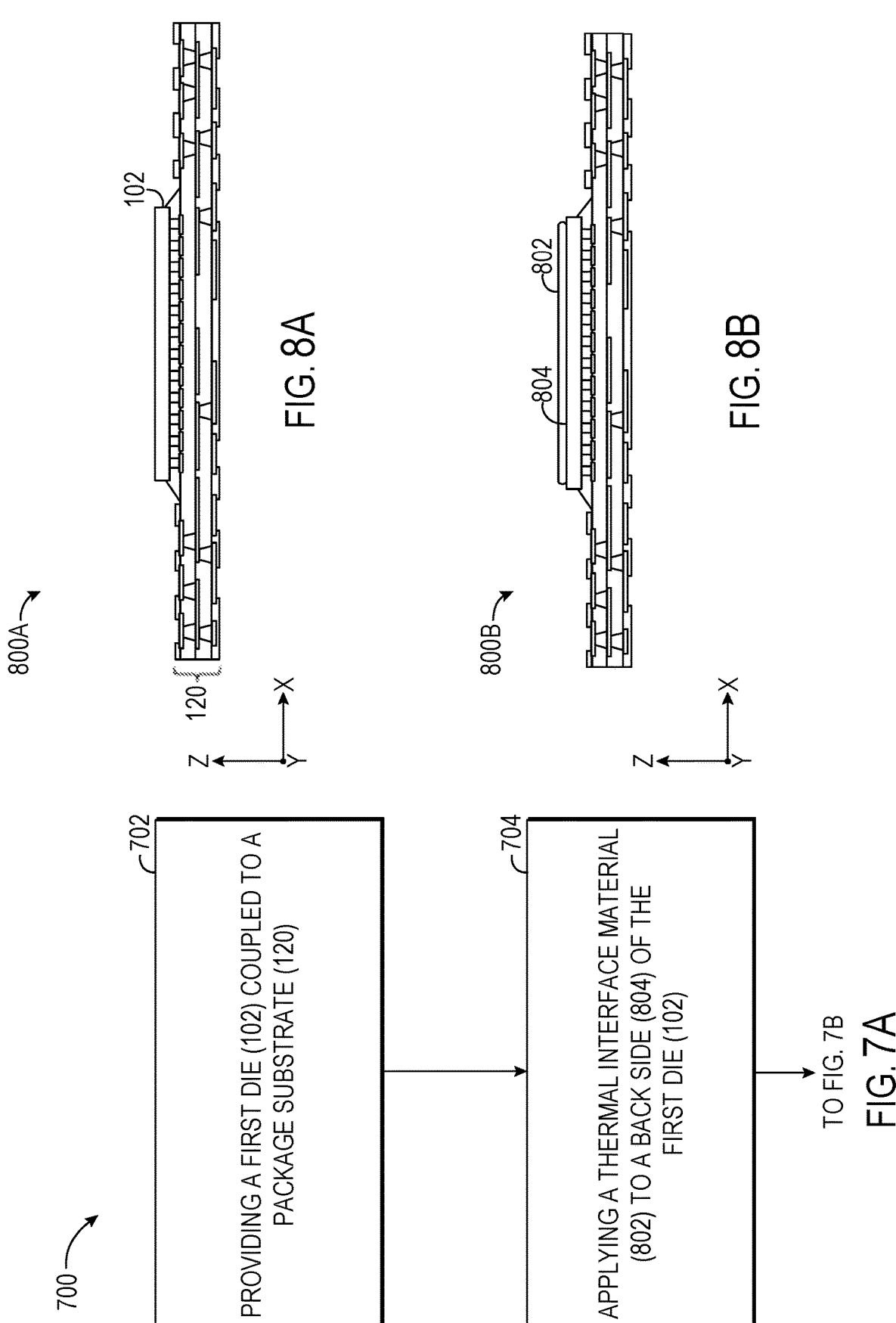
FIGS. 7A-7C are a flowchart illustrating an exemplary assembly process of assembling an IC package employing a metal block with metal interconnects thermally coupling a die to an interposer substrate for dissipating thermal energy of the die.
FIGS. 8A-8F are exemplary assembly stages during the assembly process of the IC package in FIGS. 7A-7C.
Figures 7B, 8C, 8D:
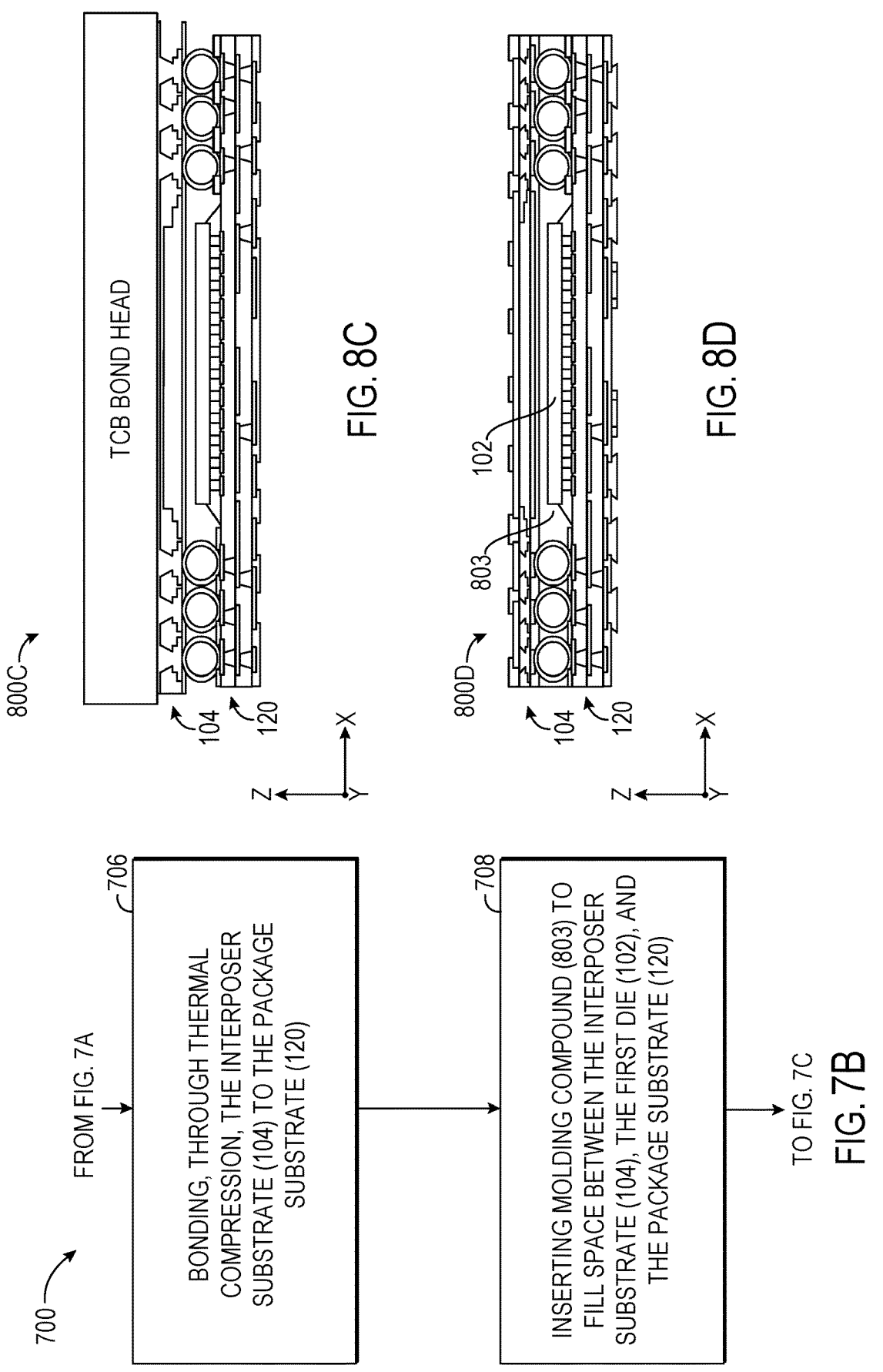
Figures 7C, 8E, 8F:
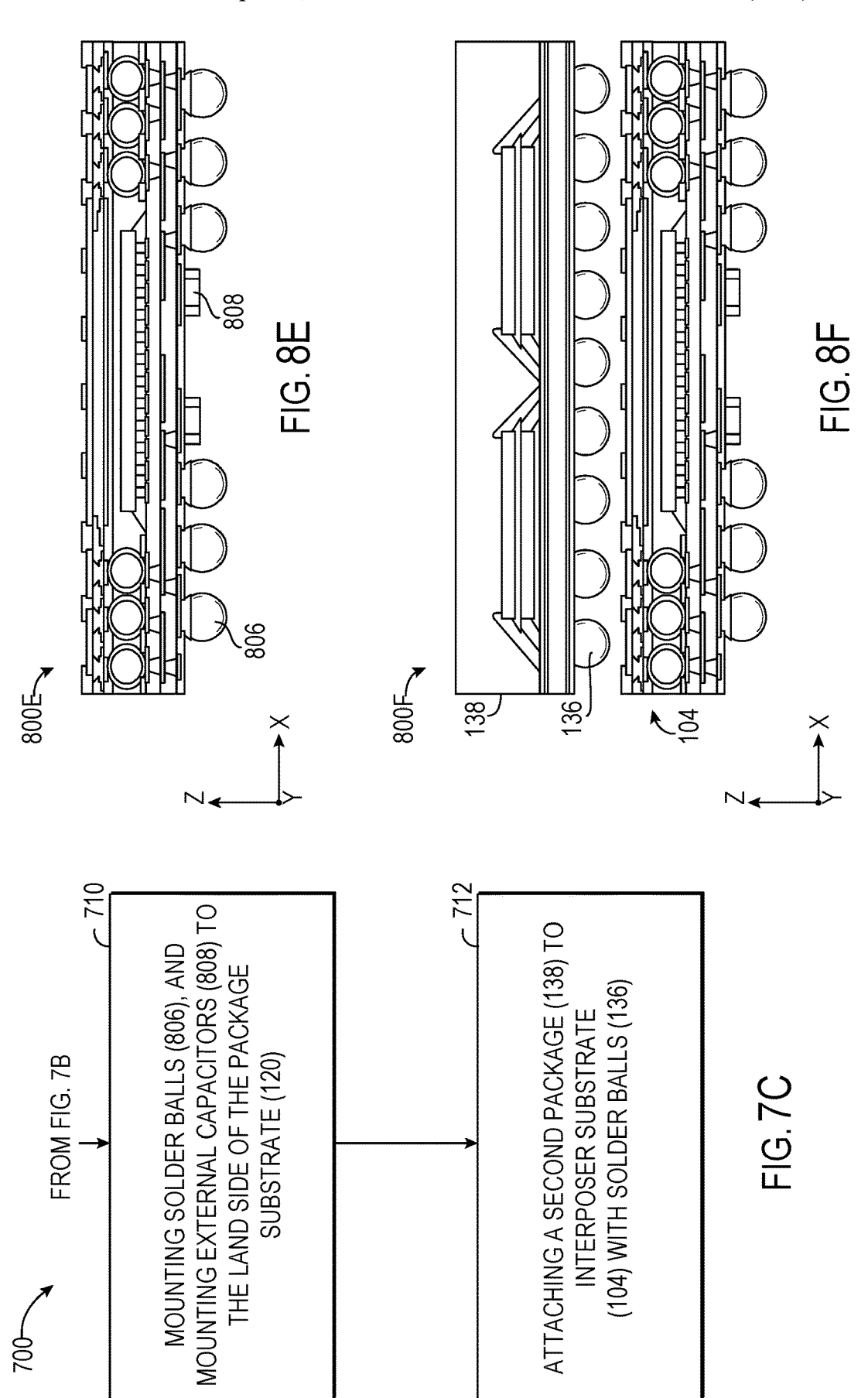

In this regard, FIGS. 7A-7C are a flowchart illustrating an exemplary assembly process 700 of assembling an IC package employing the metal block 108 thermally coupling a first die to an interposer substrate 104 for dissipating thermal energy of the first die, including, but not limited to, the IC packages 100, 200, and 300 in FIGS. 1, 2A-2C, 3A-3C as an example. The assembly process 700 in FIGS. 7A-7C will be discussed in conjunction with the interposer substrate 104, first die layer 122, and package substrate 120 in FIG. 1, as an example.

In this regard, as shown at assembly stage 800A in FIG. 8A, an exemplary initial step in the assembly process 700 is to begin with providing a first die 102 coupled to a package substrate 120 (block 702 in FIG. 7A). As also shown in the fabrication stage 800B in FIG. 8B, a next step in assembly process 700 can include applying a thermal interface material 802 to a back side 804 of the first die 102 (block 704 in FIG. 7A). The thermal interface material 802 may come in various forms and be applied in accordance with those forms. For example, the thermal interface material 802 may be a thermal paste that is applied to the first die 102 by brushing the paste on the back side 804 of the first die 102 (also known as a dispense process). In another example, the thermal interface material 802 may be in the form of a film which is adhesively attached to the back side 804 to the first die 102. As also shown in the fabrication stage 800C in FIG. 8C, a next step in the assembly process 700 can include bonding, through thermal compression, the interposer substrate 104 to the package substrate 120 (block 706 in FIG. 7B). As also shown in the fabrication stage 800D in FIG. 8D, a next step in the assembly process 700 can include inserting a molding compound 803 to fill space between the interposer substrate 104, the first die 102, and the package substrate 120 (block 708 in FIG. 7B). As also shown in the fabrication stage 800E in FIG. 8E, a next step in the assembly process 700 can optionally include mounting external interconnects, such as mounting solder balls 806, and mounting external capacitors 808 to the land side of the package substrate 120 (block 710 in FIG. 7C). As also shown in the fabrication stage 800F in FIG. 8F, a next step in the assembly process 700 can include attaching a second package 138 to the interposer substrate 104 with solder balls 136. Although the solder balls 136 are depicted in FIG. 8F as being pre-attached to the package 138, the solder balls 136 may be pre-attached to the interposer substrate 104 as shown in FIGS. 6I-1 and 6G-2 before attaching the package 138.

The IC package that includes an interposer substrate 104 having a core layer 106 which employs a metal block 108 thermally coupled to a first die for dissipating thermal energy of the first die, including, but not limited to, the IC packages 100, 200, and 300 in FIGS. 1, 2A-2C, and 3A-3C, and according to the exemplary fabrication and assembly processes in FIGS. 4 and 5A-5E, and according to aspects disclosed herein may be provided in or integrated into any processor-based device or wireless device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, and avionics systems.

Figure 9:
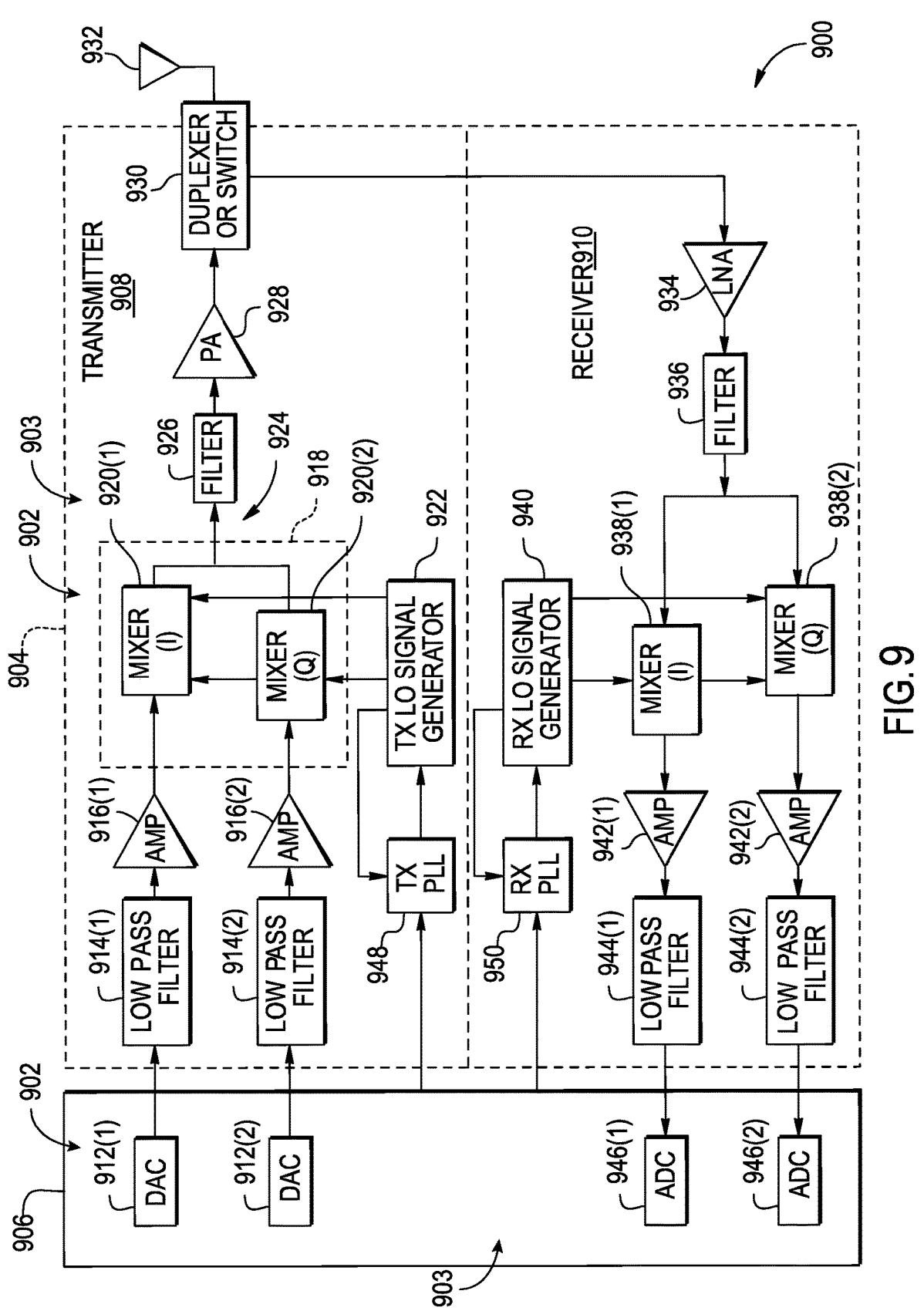
FIG. 9 is a block diagram of an exemplary wireless communications device that includes radio-frequency (RF) components deployed in an IC package employing an interposer substrate that includes a metal block with metal interconnects thermally coupling a die to the interposer substrate for dissipating thermal energy of the die, including, but not limited to, the IC packages in FIGS. 1, 2A-2C, 3A-3C, and according to the exemplary fabrication and assembly processes in FIGS. 4, 5A-5E, 6A-6G-2, 7A-7C, and 8A-8F.

In this regard, FIG. 9 illustrates an exemplary wireless communications device 900 that includes radio frequency (RF) components formed from one or more ICs 902, wherein any of the ICs 902 can include an IC package employing an interposer substrate that includes a metal block with metal interconnects thermally coupling a die to the interposer substrate for dissipating thermal energy of the die, and according to any aspects disclosed herein. The wireless communications device 900 may include or be provided in any of the above-referenced devices, as examples. As shown in FIG. 9, the wireless communications device 900 includes a transceiver 904 and a data processor 906. The data processor 906 may include a memory to store data and program codes. The transceiver 904 includes a transmitter 908 and a receiver 910 that support bi-directional communications. In general, the wireless communications device 900 may include any number of transmitters 908 and/or receivers 910 for any number of communication systems and frequency bands. All or a portion of the transceiver 904 may be implemented on one or more analog ICs, RF ICs (RFICs), mixed-signal ICs, etc.

The transmitter 908 or the receiver 910 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage in receiver 910. In the direct-conversion architecture, a signal is frequency-converted between RF and baseband in one stage. The super-heterodyne and direct-conversion architectures may use different circuit blocks and/or have different requirements. In the wireless communications device 900 in FIG. 9, the transmitter 908 and the receiver 910 are implemented with the direct-conversion architecture.

In the transmit path, the data processor 906 processes data to be transmitted and provides I and Q analog output signals to the transmitter 908. In the exemplary wireless communications device 900, the data processor 906 includes digital-to-analog converters (DACs) 912(1), 912(2) for converting digital signals generated by the data processor 906 into I and Q analog output signals, e.g., I and Q output currents, for further processing.

Within the transmitter 908, lowpass filters 914(1), 914(2) filter the I and Q analog output signals, respectively, to remove undesired signals caused by the prior digital-to-analog conversion. Amplifiers (AMPs) 916(1), 916(2) amplify the signals from the lowpass filters 914(1), 914(2), respectively, and provide I and Q baseband signals. An upconverter 918 upconverts the I and Q baseband signals with I and Q transmit (TX) local oscillator (LO) signals from a TX LO signal generator 922 through mixers 920(1), 920(2) to provide an upconverted signal 924. A filter 926 filters the upconverted signal 924 to remove undesired signals caused by the frequency upconversion as well as noise in a receive frequency band. A power amplifier (PA) 928 amplifies the upconverted signal 924 from the filter 926 to obtain the desired output power level and provides a transmit RF signal. The transmit RF signal is routed through a duplexer or switch 930 and transmitted via an antenna 932.

In the receive path, the antenna 932 receives signals transmitted by base stations and provides a received RF signal, which is routed through the duplexer or switch 930 and provided to a low noise amplifier (LNA) 934. The duplexer or switch 930 is designed to operate with a specific receive (RX)-to-TX duplexer frequency separation, such that RX signals are isolated from TX signals. The received RF signal is amplified by the LNA 934 and filtered by a filter 936 to obtain a desired RF input signal. Downconversion mixers 938(1), 938(2) mix the output of the filter 936 with I and Q RX LO signals (i.e., LO_I and LO_Q) from an RX LO signal generator 940 to generate I and Q baseband signals. The I and Q baseband signals are amplified by AMPs 942(1), 942(2) and further filtered by lowpass filters 944(1), 944(2) to obtain I and Q analog input signals, which are provided to the data processor 906. In this example, the data processor 906 includes analog-to-digital converters (ADCs) 946(1), 946(2) for converting the analog input signals into digital signals to be further processed by the data processor 906.

In the wireless communications device 900 of FIG. 9, the TX LO signal generator 922 generates the I and Q TX LO signals used for frequency upconversion, while the RX LO signal generator 940 generates the I and Q RX LO signals used for frequency downconversion. Each LO signal is a periodic signal with a particular fundamental frequency. A TX phase-locked loop (PLL) circuit 948 receives timing information from the data processor 906 and generates a control signal used to adjust the frequency and/or phase of the TX LO signals from the TX LO signal generator 922. Similarly, an RX PLL circuit 950 receives timing information from the data processor 906 and generates a control signal used to adjust the frequency and/or phase of the RX LO signals from the RX LO signal generator 940.

Figure 10:
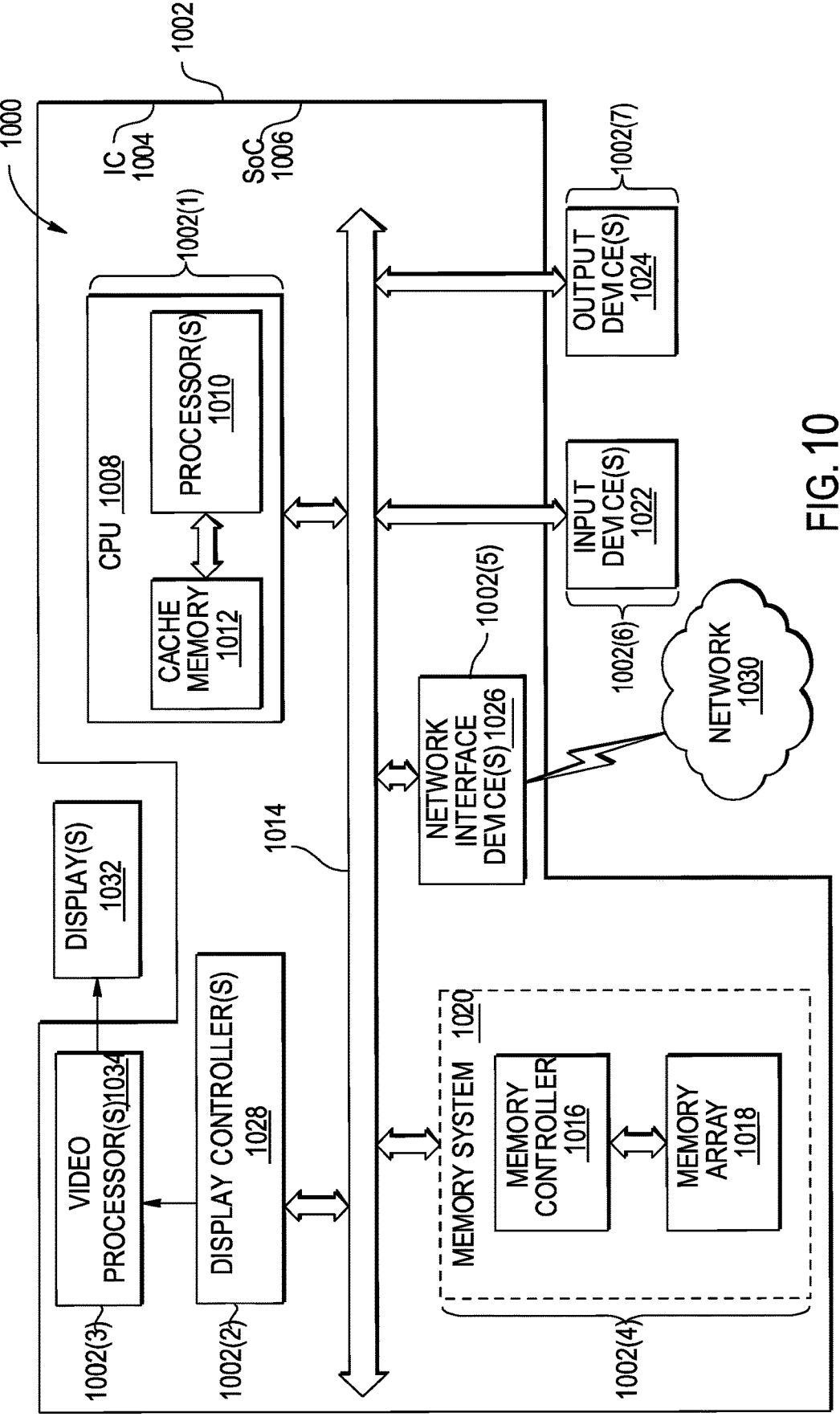
FIG. 10 is a block diagram of an exemplary processor-based system that can include components deployed in an IC package employing an interposer substrate that includes a metal block with metal interconnects thermally coupling a die to the interposer substrate for dissipating thermal energy of the die, including, but not limited to, the IC packages in FIGS. 1, 2A-2C, 3A-3C, and according to the exemplary fabrication and assembly processes in FIGS. 4, 5A-5E, 6A-6G-2, 7A-7C, and 8A-8F.

Regarding exemplary processor-based devices, FIG. 10 illustrates an example of a processor-based system 1000 that includes circuits that can be provided in IC packages 1002, 1002(1)-1002(7). Any of the IC packages 1002, 1002(1)-1002(7) can include an interposer substrate that includes a core layer having a metal block with metal interconnects thermally coupling a die to the interposer substrate for dissipating thermal energy of the die, including, but not limited to, the core layers 106, 202, 302 in FIGS. 1, 2A-2C, and 3A-3C, the related IC packages 100, 200, 300 in FIGS. 1, 2A-2C, and 3A-3C, and according to the exemplary fabrication and assembly processes in FIGS. 4, 5A-5E, 6A-6G-2, 7A-7C, and 8A-8F, and according to any aspects disclosed herein. In this example, the processor-based system 1000 may be formed as an IC 1004 in an IC package 1002 and as a system-on-a-chip (SoC) 1006. The processor-based system 1000 includes a central processing unit (CPU) 1008 that includes one or more processors 1010, which may also be referred to as CPU cores or processor cores. The CPU 1008 may have cache memory 1012 coupled to the CPU 1008 for rapid access to temporarily stored data. The CPU 1008 is coupled to a system bus 1014 and can intercouple master and slave devices included in the processor-based system 1000. As is well known, the CPU 1008 communicates with these other devices by exchanging address, control, and data information over the system bus 1014. For example, the CPU 1008 can communicate bus transaction requests to a memory controller 1016, as an example of a slave device. Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that can be in a separate IC package 1002(4) and that includes the memory controller 1016 and a memory array(s) 1018, one or more input devices 1022 (that can be in a separate IC package 1002(6)), one or more output devices 1024 (that can be in a separate IC package 1002(7)), one or more network interface devices 1026 (that can be in a separate IC package 1002(5)), and one or more display controllers 1028 (that can be in a separate IC package 1002(2)), as examples. Each of the memory system 1020, the one or more input devices 1022, the one or more output devices 1024, the one or more network interface devices 1026, and the one or more display controllers 1028 can be provided in the same or different IC packages 1002(5). The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display controller(s) 1028 and video processor(s) 1034 can be included as ICs in the same or different IC packages 1002(5), and in the same or different IC package 1002(1) containing the CPU 1008, as an example. The display(s) 1032 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium wherein any such instructions are executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
   a first package substrate;
   an substrate extending in a first direction and comprising a first side and a second side opposite the first side in a second direction orthogonal to the first direction, the substrate comprising:
      a metal block comprising a plurality of metal layers;
      a plurality of first metal interconnects adjacent to the first side and coupled to the metal block; and
      a plurality of second metal interconnects adjacent to the second side and coupled to the first package substrate; and
   a first die between the first package substrate and the second side of the substrate in the second direction, the first die coupled to the first package substrate.

2. The IC package of clause 1, wherein the substrate further comprises:
   one or more metal vias coupling the plurality of first metal interconnects to the metal block.

3. The IC package of clause 1, wherein the plurality of metal layers includes at least three metal layers and wherein the plurality of first metal interconnects are directly coupled to the metal block.

4. The IC package of any of clauses 1-3, further comprising:
   a plurality of solder balls wherein at least one first solder ball of the plurality of solder balls is disposed on the plurality of first metal interconnects,
   wherein the metal block is thermally coupled to the first die to dissipate thermal energy through the plurality of first metal interconnects and at least one first solder ball of the plurality of solder balls.

5. The IC package of clause 4, wherein at least one second solder ball of the plurality of solder balls is electrically coupled to the plurality of second metal interconnects.

6. The IC package of clause 5, further comprising:
    a plurality of vertical interconnects electrically cou-
        pling the first package substrate to the substrate,
        wherein the substrate further comprises:
        at least one metal via electrically coupling a second
            die to the first package substrate through the
            plurality of vertical interconnects and the plurality
            of second metal interconnects.
7. The IC package of clause 6, further comprising:
    a second package substrate, wherein the second die is
        disposed on the second package substrate and elec-
        trically coupled through at least the second one of the
        plurality of solder balls.
8. The IC package of any of clauses 1-7, wherein the first
    package substrate further comprises a plurality of exter-
    nal interconnects disposed on a land side of the first
    package substrate.
9. The IC package of any of clauses 1-8, wherein a width
    of the plurality of first metal interconnects is equal to or
    less than 0.23 millimeters (mm).
10. A method of fabricating an integrated circuit (IC)
    package, comprising:
    forming a first package substrate;
    forming a substrate extending in a first direction and
        comprising a first side and a second side opposite the
        first side in a second direction orthogonal to the first
        direction, wherein forming the substrate comprises:
        forming a metal block comprising a plurality of
            metal layers;
        forming a plurality of first metal interconnects adja-
            cent to the first side and coupled to the metal
            block; and
        forming a plurality of second metal interconnects
            adjacent to the second side and coupled to the first
            package substrate; and
    deploying a first die between the first package substrate
        and the second side of the substrate in the second
        direction, the first die coupled to the first package
        substrate.
11. The method of clause 10, wherein forming the sub-
    strate further comprises:
    forming one or more metal vias coupling the plurality
        of first metal interconnects to the metal block.
12. The method of clause 10, wherein the plurality of
    metal layers includes at least three metal layers and
    wherein the plurality of first metal interconnects are
    directly coupled to the metal block.
13. The method of any of clauses 10-12, further compris-
    ing:
    forming a plurality of solder balls wherein at least a first
        one of the plurality of solder balls is disposed on the
        plurality of first metal interconnects,
    wherein the metal block is thermally coupled to the first
        die to dissipate thermal energy through the plurality
        of first metal interconnects and at least the first one
        of the plurality of solder balls.
14. The method of clause 13, wherein at least a second one
    of the plurality of solder balls is electrically coupled to
    the plurality of second metal interconnects.
15. The method of clause 14, further comprising:
    forming a plurality of vertical interconnects electrically
        coupling the first package substrate to the substrate,
        wherein forming the substrate further comprises:
        forming at least one metal via electrically coupling a
            second die to the first package substrate through
            the plurality of vertical interconnects and the
            plurality of second metal interconnects.

16. The method of clause 15, further comprising:
    forming a second package substrate, wherein the sec-
        ond die is disposed on the second package substrate
        and electrically coupled through at least the second
        one of the plurality of solder balls.
17. The method of any of clauses 10-16, wherein the first
    package substrate further comprises external intercon-
    nects disposed on a land side of the first package
    substrate.
18. The method of any of clauses 10-17, wherein a width
    of the plurality of first metal interconnects is equal to or
    less than 0.23 millimeters (mm).

What is claimed is:
1. An integrated circuit (IC) package, comprising:
    a first package substrate;
    an substrate extending in a first direction and comprising
        a first side and a second side opposite the first side in
        a second direction orthogonal to the first direction, the
        substrate comprising:
        a metal block comprising at least portions of at least
            two metal layers that are directly adjacent to each
            other without an intervening dielectric layer;
        a plurality of first metal interconnects adjacent to the
            first side and coupled to the metal block; and
        a plurality of second metal interconnects adjacent to the
            second side and coupled to the first package sub-
            strate; and
    a first die between the first package substrate and the
        second side of the substrate in the second direction, the
        first die coupled to the first package substrate.
2. The IC package of claim 1, wherein the substrate
further comprises:
    one or more metal vias coupling the plurality of first metal
        interconnects to the metal block.
3. The IC package of claim 1, wherein the plurality of first
metal interconnects are directly coupled to the metal block.
4. The IC package of claim 1, further comprising:
    a plurality of solder balls wherein at least one first solder
        ball of the plurality of solder balls is disposed on the
        plurality of first metal interconnects,
    wherein the metal block is thermally coupled to the first
        die to dissipate thermal energy through the plurality of
        first metal interconnects and at least one first solder ball
        of the plurality of solder balls.
5. The IC package of claim 4, wherein at least one second
solder ball of the plurality of solder balls is electrically
coupled to the plurality of second metal interconnects.
6. The IC package of claim 5, further comprising:
    a plurality of vertical interconnects electrically coupling
        the first package substrate to the substrate, wherein the
        substrate further comprises:
        at least one metal via electrically coupling a second die
            to the first package substrate through the plurality of
            vertical interconnects and the plurality of second
            metal interconnects.
7. The IC package of claim 6, further comprising:
    a second package substrate, wherein the second die is
        disposed on the second package substrate and electri-
        cally coupled through at least the second one of the
        plurality of solder balls.
8. The IC package of claim 1, wherein the first package
substrate further comprises a plurality of external intercon-
nects disposed on a land side of the first package substrate.
9. The IC package of claim 1, wherein a width of the
plurality of first metal interconnects is equal to or less than
0.23 millimeters (mm).

10. A method of fabricating an integrated circuit (IC) package, comprising:

forming a first package substrate;

forming a substrate extending in a first direction and comprising a first side and a second side opposite the first side in a second direction orthogonal to the first direction, wherein forming the substrate comprises:

forming a metal block comprising at least portions of at least two metal layers that are directly adjacent to each other without an intervening dielectric layer;

forming a plurality of first metal interconnects adjacent to the first side and coupled to the metal block; and forming a plurality of second metal interconnects adjacent to the second side and coupled to the first package substrate; and deploying a first die between the first package substrate and the second side of the substrate in the second direction, the first die coupled to the first package substrate.

11. The method of claim 10, wherein forming the substrate further comprises:

forming one or more metal vias coupling the plurality of first metal interconnects to the metal block.

12. The method of claim 10, wherein the plurality of first metal interconnects are directly coupled to the metal block.

13. The method of claim 10, further comprising:

forming a plurality of solder balls wherein at least a first one of the plurality of solder balls is disposed on the plurality of first metal interconnects, wherein the metal block is thermally coupled to the first die to dissipate thermal energy through the plurality of first metal interconnects and at least the first one of the plurality of solder balls.

14. The method of claim 13, wherein at least a second one of the plurality of solder balls is electrically coupled to the plurality of second metal interconnects.

15. The method of claim 14, further comprising:

forming a plurality of vertical interconnects electrically coupling the first package substrate to the substrate, wherein forming the substrate further comprises:

forming at least one metal via electrically coupling a second die to the first package substrate through the plurality of vertical interconnects and the plurality of second metal interconnects.

16. The method of claim 15, further comprising:

forming a second package substrate, wherein the second die is disposed on the second package substrate and electrically coupled through at least the second one of the plurality of solder balls.

17. The method of claim 10, wherein the first package substrate further comprises external interconnects disposed on a land side of the first package substrate.

18. The method of claim 10, wherein a width of the plurality of first metal interconnects is equal to or less than 0.23 millimeters (mm).

* * * * *